United States Patent
Miyakawa

(10) Patent No.: US 7,238,615 B2
(45) Date of Patent: Jul. 3, 2007

(54) FORMATION METHOD FOR METAL ELEMENT, PRODUCTION METHOD FOR SEMICONDUCTOR DEVICE, PRODUCTION METHOD FOR ELECTRONIC DEVICE, SEMICONDUCTOR DEVICE, ELECTRONIC DEVICE, AND ELECTRONIC EQUIPMENT

(75) Inventor: Takuya Miyakawa, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 399 days.

(21) Appl. No.: 10/746,000

(22) Filed: Dec. 29, 2003

(65) Prior Publication Data

US 2004/0203235 A1 Oct. 14, 2004

(30) Foreign Application Priority Data

Jan. 15, 2003 (JP) ............................. 2003-007047

(51) Int. Cl.
*H01L 21/44* (2006.01)
(52) U.S. Cl. ............................... 438/677; 257/E21.175
(58) Field of Classification Search ............... 438/677; 257/E21.175; 29/DIG. 12
See application file for complete search history.

(56) References Cited

U.S. PATENT DOCUMENTS

2002/0149118 A1* 10/2002 Yamaguchi et al. ......... 257/778
2002/0157610 A1* 10/2002 Sekiguchi et al. . 118/723 OVE
2003/0116439 A1* 6/2003 Seo et al. .................... 205/125

FOREIGN PATENT DOCUMENTS

| JP | A 11-238703 | 8/1999 |
|---|---|---|
| JP | A 2000-228374 | 8/2000 |
| JP | A 2000-260865 | 9/2000 |
| JP | A 2001-127062 | 5/2001 |
| JP | A 2001-181851 | 7/2001 |
| JP | A 2001-284289 | 10/2001 |
| JP | 2001-127062 | * 11/2001 |
| JP | A 2001-323381 | 11/2001 |
| JP | A 2002-26017 | 1/2002 |
| JP | A 2002-164635 | 6/2002 |

* cited by examiner

*Primary Examiner*—George R. Fourson
*Assistant Examiner*—John M Parker
(74) *Attorney, Agent, or Firm*—Oliff & Berridge, PLC

(57) ABSTRACT

A metal element formation method includes a seed layer formation step for forming a seed layer on a treatment surface of a substrate, and a plating formation step for forming a plating layer on the seed layer, wherein in the seed layer formation step, a liquid repellent section is formed on the treatment surface, and a liquid phase method is used to form the seed layer in a region outside the liquid repellent section.

9 Claims, 13 Drawing Sheets

FORMATION METHOD FOR METAL ELEMENT, PRODUCTION METHOD FOR SEMICONDUCTOR DEVICE, PRODUCTION METHOD FOR ELECTRONIC DEVICE, SEMICONDUCTOR DEVICE, ELECTRONIC DEVICE, AND ELECTRONIC EQUIPMENT

BACKGROUND OF THE INVENTION

1. Field of the Invention

The present invention relates to a formation method for a metal element, a production method for a semiconductor device, a production method for an electronic device, a semiconductor device and an electronic device, as well as an electronic equipment.

Priority is claimed to Japanese Patent Application No. 2003-7047, filed Jan. 15, 2003, which is incorporated herein by reference.

2. Description of Related Art

Conventionally, the metal elements used within semiconductor devices and electronic devices have frequently used metals such as Al (aluminum). However, as the demands increase for ever smaller and faster semiconductor devices, and higher performance electronic devices, it is becoming increasingly difficult to ensure an adequate level of performance with aluminum wiring or the like. Copper wiring techniques, which offer superior electromigration resistance to aluminum and also provide low resistance, are attracting considerable attention as one potential solution to this problem, and are being widely investigated for potential applications.

In the formation of a metal element from copper, the properties of copper mean that etching methods are not particularly suitable, and consequently, a process known as damascene is used, in which copper metal is used to fill preformed grooves. In such a damascene process, predetermined grooves are formed in advance in the treatment surface of an interlayer insulating film formed from silicon oxide or the like, copper metal is subsequently used to fill those grooves, and then any excess copper metal is removed by CMP (Chemical Mechanical Polishing).

An example of a known method that can be used for forming a film of copper metal within these grooves is a method in which a seed layer is first formed, and then a plating layer is formed from this seed layer, as is shown, for example, in Japanese Patent Application Laid-Open (JP-A) No. Heisei 11-238703. The seed layer is formed using a sputtering method or the like, and is formed across the entire surface of the interlayer insulating film, including the grooves. Furthermore, the plating layer is formed by depositing metal atoms within a plating liquid onto the seed layer.

However, in the technique disclosed above, during the formation of the seed layer, the sputtering method forms the seed layer across the entire surface of the interlayer insulating film, and it is not possible to form the seed layer only within certain desired positions.

Furthermore, because the seed layer is formed across the entire treatment surface, the plating layer also gets formed across the entire surface, meaning the excess copper metal must then be removed by a CMP method, which is essentially a wasted method.

In addition, in order to remove all of the excess copper metal during the CMP method, at least the surface of the interlayer insulating film must also be polished, and consequently, a comparatively hard material such as $SiO_2$ or the like must be used for the interlayer insulating film. This results in an undesirable restriction in the number of materials that can be selected for use as the interlayer insulating film.

Furthermore, when a damascene process is used to form multilayer interlayer insulating films, that is, during formation of a so-called dual damascene structure, an etching stop layer must be formed between respective interlayer insulating films, which results in an undesirable increase in the number of steps in the method.

The present invention takes the above circumstances into consideration, with an object of providing a metal element formation method for forming a metal element from a selected material such as copper metal, which does not require the use of CMP, as well as providing a production method for a semiconductor device, a production method for an electronic device, a semiconductor device and an electronic device, and an electronic equipment.

SUMMARY OF THE INVENTION

In order to achieve the above object, the present invention provides the different aspects described below.

The first aspect of the present invention is a metal element formation method has a seed layer formation step for forming a seed layer on a treatment surface of a substrate, and a plating formation step for forming a plating layer on the seed layer, wherein in the seed layer formation step, a liquid repellent section for repelling a liquid material is formed on the treatment surface, and a liquid phase method is used to form the seed layer in a region outside the liquid repellent section.

In this description, the term "metal element" refers to any element formed from a metal, and includes wiring that displays continuity, the electrodes of capacitative elements such as capacitors, induction elements such as coils, and gate electrodes for semiconductor devices. There are no particular restrictions on the form of the metal element, provided formation is possible by a plating method.

Furthermore, the term "substrate" refers to substrates formed from prescribed materials such as glass substrates or silicon wafers, as well as circuit boards on which wiring layers or interlayer insulating films have already been formed.

The term "seed layer" refers to a backing film required for forming the plating layer during the plating method, and is a film to which a predetermined voltage is applied when the seed layer and the plating liquid are in a state of contact.

Furthermore, the term "plating layer" refers to the thickened layer that is produced by using the aforementioned plating method to deposit metal atoms onto the seed layer.

The "region outside the liquid repellent section" refers to the region that displays a relatively higher liquid affinity than the liquid repellent section, and this region is formed in the shape of a desired pattern.

The term "liquid phase method" refers to a method used for bringing the substrate and a liquid material into a state of contact, and includes methods such as spin coating, slit coating, dip coating, spray coating, printing techniques, and liquid discharge methods. The liquid material used in this liquid phase method comprises the material of the seed layer and a solvent.

According to this aspect of the present invention, a region with a desired pattern is formed outside of the aforementioned liquid repellent section, a liquid phase method is used to position a liquid material within this region in a state of contact, the solvent of the liquid material is evaporated to form a seed layer, and a plating method is then used to form a plating layer. In other words, a plating layer can be formed that corresponds with the region outside the liquid repellent section.

Furthermore, in those cases where slit coating is used as the liquid phase method, because such slit coating utilizes capillary action, liquid material usage efficiencies of 95% or greater can be achieved with relative ease, meaning production costs are able to be reduced.

In those cases where a liquid discharge method is used as the liquid phase method, not only can the usage efficiency of the liquid material be improved, but the liquid material can be positioned on the substrate in any desired pattern.

The second aspect of the present invention is a metal element formation method has a seed layer formation step for forming a seed layer on a treatment surface of a substrate, and a plating formation step for forming a plating layer on the seed layer, wherein the treatment surface comprises concave sections, and in the seed layer formation step, a liquid phase method is used to form the seed layer inside the concave sections.

The term "concave section" refers to a specific region formed on the treatment surface of the substrate. There are no particular restrictions on the method used to form the concave section, and concave sections formed by carving out a portion of the substrate are acceptable, as are concave sections formed by providing a convex section of a preferred material on top of the substrate, and then forming a relative concave section within this convex section.

According to this aspect of the present invention, by using a liquid phase method to position a liquid material in a state of contact with the treatment surface, the liquid material can flow into the concave sections, dissolving the gas present within the concave sections, so that the concave sections are filled with the liquid material, and gas within the concave sections is expelled externally. In addition, the solvent of the liquid material in the concave sections is then evaporated to form a seed layer, and a plating method is then used to form a plating layer. In other words, a plating layer can be formed that fills the concave sections. Furthermore, because the plating layer is formed along the inner surfaces of the concave sections, the direction of the growth of the plating layer can be regulated.

Furthermore, yet another aspect of the metal element formation method of the present invention is the metal element formation method described above, wherein in the seed layer formation step, the seed layer is formed in concave sections formed in an interlayer insulating film.

There are no particular restrictions on the method used for forming the concave sections in the interlayer insulating film, and concave sections formed by carving out a portion of the interlayer insulating film are acceptable, as are concave sections formed by providing a convex section of the interlayer insulating film on top of the substrate, and then forming a relative concave section within this convex section.

According to this aspect of the present invention, not only are the same effects as those described for the above metal element formation method achieved, but a plating layer that is enclosed within an interlayer insulating film can also be formed.

Furthermore, because the plating layer is exposed at the surface of the interlayer insulating film, the CMP process can be omitted, enabling a simplification of the overall process, and a reduction in production costs.

Furthermore, yet another aspect of the metal element formation method of the present invention is the metal element formation method described above, wherein in the seed layer formation step, the seed layer is formed in concave sections formed in a resist layer.

There are no particular restrictions on the method used for forming the concave sections in the resist layer, and concave sections formed by developing the resist are acceptable, as are concave sections formed by providing a convex section formed from the resist on top of the substrate, and then forming a relative concave section within this convex section. In the following description, the step for forming the concave sections in the resist layer is referred to as the resist layer formation step.

According to this aspect of the present invention, the same effects as those described for the above metal element formation method can be achieved.

Furthermore, in those cases where the resist layer is first formed uniformly across the substrate, and is subsequently patterned by exposure, the seed layer and the plating layer can also be formed with the same pattern as the exposure mask.

Furthermore, in those cases where a liquid discharge method is used to discharge a resist into a specified pattern on top of a substrate, thereby forming a convex shaped resist layer, the seed layer and the plating layer can be formed in relative concave sections formed within the convex pattern. In such cases, an exposure mask becomes unnecessary, and seed layers and plating layers can be formed in a multitude of patterns.

Furthermore, following the formation of the plating layer, the resist layer can be removed, and by repeating the resist layer formation step, the seed layer formation step and the plating layer formation step to form multiple layers of metal elements, and then removing the resist layers as a final step, the plating layers can be left, forming a so-called open wiring structure.

Furthermore, yet another aspect of the metal element formation method of the present invention is the metal element formation method described above, wherein in the seed layer formation step, the surface of the treatment surface, including the inner surfaces of the concave sections, has liquid repellent properties.

According to this aspect of the present invention, the filling of the inside of the concave sections can be promoted, and the liquid material adhered to areas of the treatment surface outside the concave sections flows into the concave sections, enabling the liquid material to be confined within the concave sections.

Furthermore, yet another aspect of the metal element formation method of the present invention is the metal element formation method described above, wherein in the seed layer formation step and the plating layer formation step, the seed layer and the plating layer are formed using the same material.

The term "the same material" means that the component materials that make up the seed layer and the plating layer are the same. Specifically, the material contained within the liquid material used in the seed layer formation step, and the material contained within the plating liquid used in the plating layer formation step are the same.

According to this aspect of the present invention, because a metal element of a single material is formed on the substrate, a desired material can be selected. For example, in a case in which electric conductivity is required through the substrate and the metal element, a low resistance metal can be selected as the single material, which is then used to form the seed layer and the plating layer, thereby enabling the formation of a low resistance metal element.

Furthermore, yet another aspect of the metal element formation method of the present invention is the metal element formation method described above, wherein in the seed layer formation step and the plating layer formation step, the seed layer and the plating layer are formed using different materials.

According to this aspect of the present invention, because the metal element formed on the substrate is formed from a seed layer and a plating layer of different materials, the seed layer material and the plating layer material can be selected in accordance with the targeted purpose. For example, in a case in which it is desirable to have a seed layer formed from a material that is comparatively difficult to oxidize, and a plating layer formed from a low resistance material, by selecting and using Ag (silver) for the seed layer and Cu (copper) for the plating layer, oxidation of the material during the seed layer formation step can be suppressed, and a low resistance plating layer can be formed. Furthermore, in a case in which it is desirable to prevent diffusion of the metal from the plating layer into the substrate, a material with the functions of a so-called barrier layer can be selected as the seed layer material. Examples of suitable barrier layer materials include Ti (titanium) and W (tungsten).

Yet another aspect of the metal element formation method of the present invention is the metal element formation method described above, wherein a liquid material comprising metal atoms is used in the seed layer formation step.

According to this aspect of the present invention, a liquid phase method can be easily utilized. Furthermore, a dispersion comprising a mixture of fine metal particles and a volatile solvent is ideal as this liquid material.

Yet another aspect of the metal element formation method of the present invention is the metal element formation method described above, wherein a liquid material comprising copper atoms is used in the seed layer formation step.

Copper is known as a low resistance metal.

According to this aspect of the present invention, a seed layer of a low resistance metal can be formed.

Yet another aspect of the metal element formation method of the present invention is the metal element formation method described above, wherein a liquid material comprising an organocopper compound is used in the seed layer formation step.

The organocopper compound is a material which does not display inherent conductivity, but gains conductive characteristics similar to those of copper when subjected to firing under heat treatment.

According to this aspect of the present invention, a seed layer of a low resistance metal can be formed. Furthermore, when the organic compound is compared with fine particles of the metal, it is evident that in the fine metal particles, individual particles exist in a state of point contact, with voids existing in the spaces between particles, whereas in the organic compound, a portion of the organic matter remains in the space between particles. In other words, when a seed layer is formed using this type of organocopper compound, a more dense film can be formed than that which is possible using fine metal particles.

Yet another aspect of the metal element formation method of the present invention is the metal element formation method described above, further comprising an insulating film formation step for forming an insulating film on the treatment surface on which the plating layer has been formed, and an etching step for etching the insulating film and exposing the plating layer, which are conducted following completion of the plating layer formation step.

In the etching step, there are no particular restrictions on the method used, which may be either a wet etching method in which the substrate is immersed in a chemical etching liquid, or a dry etching method in which the substrate is exposed to a reactive gas within a vacuum atmosphere.

According to this aspect of the present invention, the plating layer is exposed by etching the insulating film, and consequently the same effects as those achieved through a conventional CMP process can be obtained without requiring a CMP step, which enables a simplification of the process, and a reduction in production costs.

Furthermore, in a conventional CMP process, a comparatively hard material such as $SiO_2$ or the like is required for the insulating film, but with this aspect of the present invention the CMP step is omitted, and consequently there is no need to restrict the material of the insulating film in this manner, meaning the degree of freedom in selecting the insulating film material is increased significantly. For example, if materials with low dielectric constants, so-called low-k materials, are selected then because there is no necessity to use a hard material, the ideal material can be selected.

Furthermore, another pattern or element can be easily formed on top of the exposed plating layer. For example, a separate metal element can be formed on top of the plating layer using the metal element formation method described above, thereby enabling easy layering of the metal elements.

Furthermore, yet another aspect of the metal element formation method of the present invention is the metal element formation method described above, wherein in the insulating film formation step, an insulating film that has been formed as a thin film is transferred to the treatment surface, and forms an insulating film on the treatment surface.

The term "thin film" is an insulating film which is formed prior to being transferred to the treatment surface.

According to this aspect of the present invention, the insulating film is formed in advance as a thin film, and is then transferred to the treatment surface to form an insulating film on the treatment surface. This enables the insulating film to be formed with relative ease.

Furthermore, yet another aspect of the metal element formation method of the present invention is the metal element formation method described above, wherein in the insulating film formation step, the insulating film is formed by placing a liquid material containing insulating matter in contact with the treatment surface, and conducting a subsequent heat treatment.

The term "liquid material containing an insulating substance" is a liquid material for use in a liquid phase method, and comprises material for forming the insulating film and a solvent.

According to this aspect of the present invention, the solvent within the liquid material is evaporated by the heat treatment, causing the insulating matter to remain baked onto the treatment surface, thereby enabling formation of the desired insulating film.

Furthermore, when forming a multilayered structure of interlayer insulating films, there is no need to form each of the insulating films separately, and there is no need to form an etching stop layer to prevent etching of the insulating film, meaning the interlayer insulating films can be formed in a single batch. As a result, the overall process can be simplified, and production cost reductions are also possible.

Furthermore, following formation of just the metal element using the above metal element formation method, the insulating film can then be formed so as to embed the metal element, and consequently in comparison with cases that use a method other than a liquid phase method, the overall method can be simplified, and production cost reductions are possible. In addition, a metal element formed by repeating the resist layer formation step, the seed layer formation step and the plating layer formation step, and then removing the resist layer as a final step, namely, a so-called open wiring structure, can also be formed in advance, and this open wiring structure then embedded by forming the insulating film.

The third aspect of the present invention is a production method for a semiconductor device according to the present invention is a production method for a semiconductor device equipped with at least one of wiring, an electrode, and an interlayer insulating film, wherein the semiconductor device is produced using a metal element formation method described above.

According to this aspect of the present invention, the same effects as those described for the above metal element formation method can be achieved. Furthermore, in the formation of the interlayer insulating film, there is no need to restrict the film material to a comparatively hard material such as $SiO_2$, meaning the degree of freedom in selecting the insulating film material is increased significantly. For example, when so-called low-k materials are used for the interlayer insulating film, the degree of freedom available in selecting the material is increased significantly, and consequently the ideal material can be selected, meaning that the operating frequency of the semiconductor device can be raised with this shift to low-k materials.

A production method for an electronic device according to the present invention is a production method for an electronic device equipped with a plurality of wiring layers, connection posts which interconnect the wiring layers, and interlayer insulating films formed between the wiring layers, wherein the electronic device is produced using a metal element formation method described above.

According to this aspect of the present invention, the same effects as those described for the above metal element formation method can be achieved.

Furthermore, a semiconductor device of the present invention is a semiconductor device equipped with at least one of wiring, an electrode, and an interlayer insulating film, which is produced using the production method described above.

According to this aspect of the present invention, the same effects as those described for the above production method for a semiconductor device can be achieved.

An electronic device of the present invention is an electronic device equipped with a plurality of wiring layers, connection posts which interconnect the wiring layers, and interlayer insulating films formed between the wiring layers, which is produced using the production method described above.

According to this aspect of the present invention, the same effects as those described for the above production method for an electronic device can be achieved.

An electronic equipment according to the present invention comprises a semiconductor device or an electronic device of the present invention.

Examples of this type of electronic equipment include information processing equipment such as mobile telephones, personal digital assistants, watches, word processors, and personal computers. Using a semiconductor device or an electronic device of the present invention within these types of electronic equipment, enables the production and supply of low cost equipment.

DETAILED DESCRIPTION OF THE INVENTION

Figure 1A:
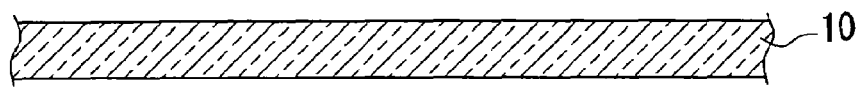
FIGS. 1A to 1G are schematic cross sectional views of a substrate describing a metal element formation method of the present invention.

As follows is a more detailed description of a metal element formation method, a production method for a semiconductor device, a production method for an electronic device, a semiconductor device and an electronic device, and electrical equipment according to the present invention, with reference to the drawings.

In the drawings, each of the layers and other components is shown at a size that enables ready identification, meaning the displayed relative dimensions of each of the layers and other components may differ from their actual values.

(First Embodiment)

As follows is a description of a metal element formation method according to the present invention.

FIG. 1A to FIG. 1G, FIG. 2A and FIG. 2B show schematic cross sectional views of a substrate in the main steps of a metal element formation method of this embodiment.

As shown in FIG. 1A, a substrate 10 is the target material on which the metal element of the present embodiment is formed, and the material for this substrate can be selected in accordance with the targeted application. For example, in cases where light transmission is required, a transparent material such as glass or the like can be selected, in cases where flexibility is required, a resin material or the like can be selected, and in cases where a semiconductor element is to be formed, a silicon wafer is selected. The substrate 10 may also be a multilayered wiring board with a plurality of preformed conductive films and insulating films, or a circuit board with preformed wiring layers and interlayer insulating films.

The metal element formation method of this embodiment comprises a seed layer formation step, a plating layer formation step, an interlayer insulating film formation step (an insulating film formation step), and an etching step. As follows is a description of each of these steps, together with a description of the processes and/or devices used in each step.

(Seed Layer Formation Step)

As shown in FIG. 1B through FIG. 1F, the seed layer formation step comprises a liquid repellent section formation step, a lyophilic section formation step, and a film formation step.

Figure 1B:
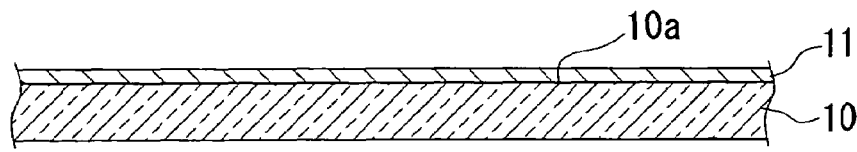

First, the liquid repellent section formation step is conducted as shown in FIG. 1B, and in this embodiment, a slit coating process was used for the liquid phase method. The liquid repellent section is then formed by a subsequent drying treatment.

Figure 3A:
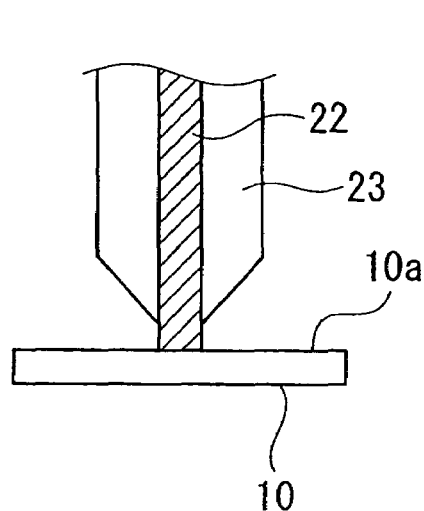
FIGS. 3A and 3B are schematic cross sectional views showing an application method using a slit coating system.
Figure 3B:
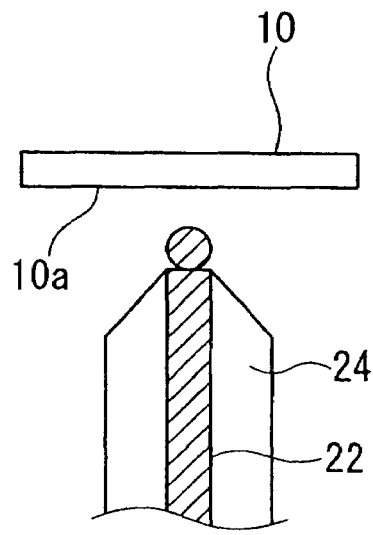

FIGS. 3A and 3B are schematic cross sectional views describing the slit coating method. Slit coating systems can be broadly classified into two different types, namely, the system shown in FIG. 3A, and the system shown in FIG. 3B.

In the system shown in FIG. 3A, a liquid material 22 is discharged in a downward direction. In this slit coating system, a slit section 23 with a slit shaped opening is positioned above the substrate 10, and the treatment surface 10a of the substrate 10 is positioned facing upwards. By discharging the liquid material 22 from the slit section 23 while the substrate 10 and the slit section 23 are moved relative to each other, a uniform quantity of the liquid material 22 can be applied rapidly across the entire treatment surface 10a.

The system shown in FIG. 3B shows a slit coating system that utilizes capillary action. In this slit coating system, a slit section 24 with a capillary is positioned below the substrate 10, and the treatment surface 10a of the substrate 10 is positioned facing downwards. By moving the substrate 10 and the slit section 24 relative to each other, while maintaining a predetermined distance between the opening of the slit section 24 and the treatment surface 10a, capillary action causes the liquid material 22 to be drawn up onto the treatment surface 10a, enabling a uniform quantity of the liquid material 22 to be applied rapidly across the entire treatment surface 10a.

Furthermore, in a slit coating system that utilizes capillary action, the usage efficiency of the discharged liquid material can easily exceed 95%, meaning production costs can be reduced.

The liquid phase method in the liquid repellent section formation step is not restricted to a slit coating method, and any of a variety of other liquid phase methods can also be employed, including spin coating, dip coating, spray coating, printing methods, and liquid discharge methods.

Because the liquid phase method does not require high cost vacuum equipment, the cost of the production facilities can be reduced.

Furthermore, the liquid material 22 used for forming the liquid repellent section 11 utilizes the liquid repellent raw material dissolved in a solvent, and in this particular embodiment, a liquid material comprising Optool DSX (manufactured by Daikin Industries Co., Ltd.) diluted with a fluorine based solvent is ideal.

Following application of the liquid material 22 to the treatment surface 10a of the substrate 10 using the slit coating method, the substrate 10 is exposed to a saturated vapor pressure atmosphere and held for a predetermined period of time, so that the liquid material 22 within lyophilic sections 12 does not dry out, and the concentration distribution of the liquid material 22 can be satisfactorily equalized. The substrate 10 is then placed in a baking furnace or the like, and the solvent contained within the liquid material 22 is removed via a drying treatment, thereby forming the liquid repellent section 11.

Figure 1C:
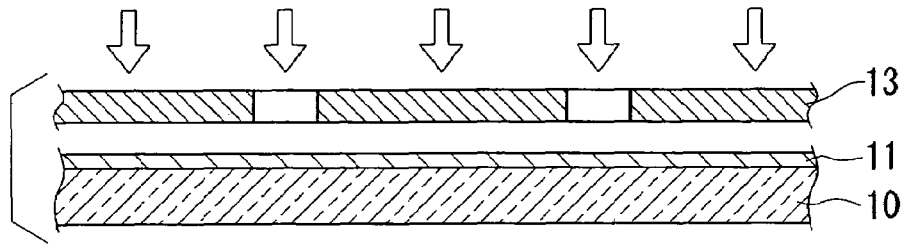

Subsequently, the lyophilic section formation step shown in FIG. 1C is carried out, and in this embodiment, a portion of the liquid repellent section 11 is removed to form the lyophilic section.

Figure 1D:
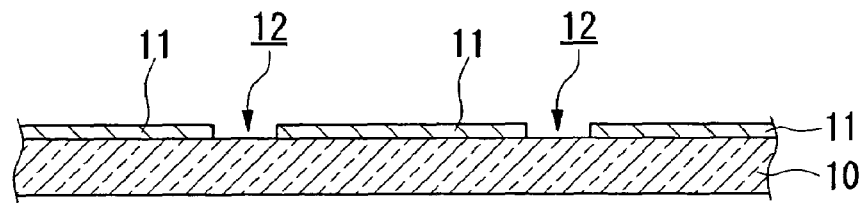

In this lyophilic section formation step, a mask 13 is positioned facing the substrate 10, and UV light is then irradiated through the mask 13 and onto the substrate 10, and the liquid repellent material in the irradiated sections of the liquid repellent section 11 decomposes and vaporizes, thereby removing the liquid repellent material from those sections. In other words, the lyophilic sections (the areas outside the liquid repellent section) 12 shown in FIG. 1D are formed in positions corresponding with the pattern of the mask 13.

Figure 1E:
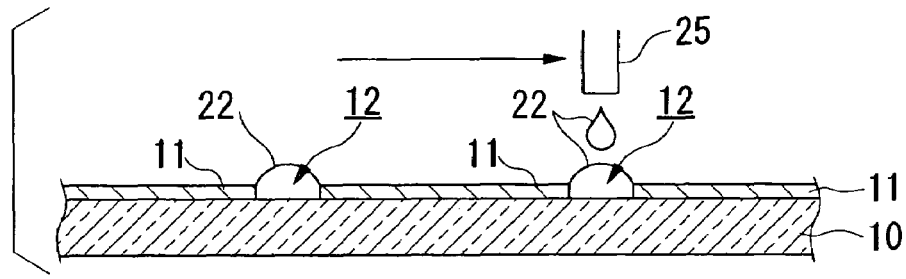

Next, the film formation step shown in FIG. 1E is carried out, and in this embodiment, a liquid discharge method is used as the liquid phase method, and a seed layer is formed using a drying treatment and a heat treatment. Furthermore, the liquid material 22 used in this step is a dispersion comprising a mixture of fine metal particles of copper, which form the seed layer, and toluene which functions as the solvent.

In the liquid discharge method, a discharge nozzle 25 and the substrate 10 are moved relatively to each other, while the discharge nozzle 25 discharges individually controlled drops of the liquid material 22 into the lyophilic sections 12, thereby filling the lyophilic sections 12 with the liquid material 22. Even if the liquid material 22 is discharged onto the liquid repellent section 11 near a lyophilic section 12 as a result of an error in the discharge positioning, the liquid material 22 does not collect on the upper surface of the liquid repellent section 11, but rather flows into the lyophilic section 12.

By using the liquid discharge method described above, the usage efficiency of the liquid material can be improved, and the liquid material 22 can be positioned within the lyophilic sections 12 that have been formed in a predetermined pattern.

Figure 1F:
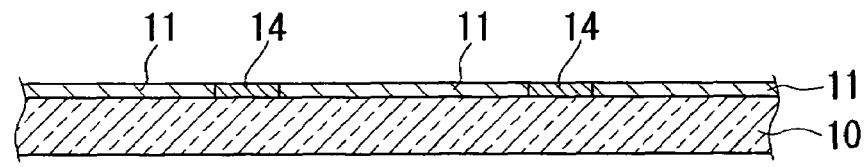

Following filling of the lyophilic sections 12 with the liquid material 22 in this manner, the substrate 10 is exposed to a saturated vapor pressure atmosphere and held for a predetermined period of time, so that the liquid material 22 within the lyophilic sections 12 does not dry out, and the concentration distribution of the liquid material 22 can be satisfactorily equalized. The substrate 10 is then placed in a baking furnace or the like, and the solvent contained within the liquid material 22 is removed via a drying treatment, and by performing a subsequent heat treatment, the fine metal particles are fired and form a seed layer 14 of copper metal as shown in FIG. 1F.

The liquid phase method in this film formation step is not restricted to a liquid discharge method, and any of a variety of other liquid phase methods can also be employed, including spin coating, slit coating, dip coating, spray coating, printing methods, and other liquid discharge methods. Because the liquid phase method does not require high cost vacuum equipment, the cost of the production facilities can be reduced.

Furthermore, in the example described above, a dispersion of fine metal particles of copper was used as the liquid material 22, but liquid materials formed by diluting either fine particles of silver (brand name: "Perfect Silver", manufactured by Vacuum Metallurgical Co., Ltd.) or a dispersion of fine particles of gold (brand name: "Perfect Gold", manufactured by Vacuum Metallurgical Co., Ltd.) with toluene can also be used.

(Plating Layer Formation Step)

Figure 1G:
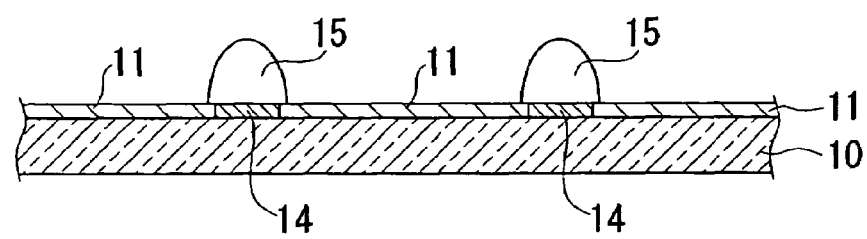
Figure 4:
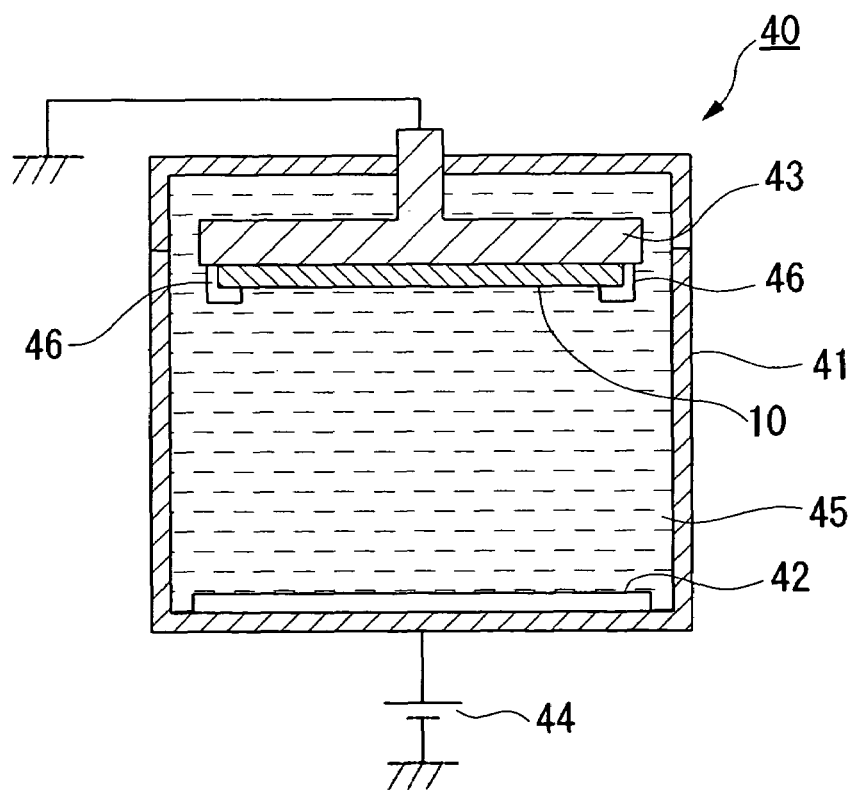
FIG. 4 is a schematic cross sectional view of a plating apparatus used in a plating layer formation method.

In the plating layer formation step, a plating apparatus shown in FIG. 4 is used to form a plating layer 15 shown in FIG. 1G.

The plating apparatus 40 is a so-called electroplating apparatus, and comprises a plating liquid tank 41, a lower electrode 42, an upper electrode 43, and a power source 44. A plating liquid 45 is used to fill the plating liquid tank 41, and this plating liquid 45 uses a liquid that is ideally suited to forming the plating layer, and in the present embodiment utilizes a copper sulfate based copper electroplating liquid. The lower electrode 42 and the anode side of the power source 44 (the + side) are connected, and the upper electrode 43 is equipped with a holder 46 that is used to support and retain the substrate 10, thereby ensuring a high level of continuity between the upper electrode 43 and the substrate 10. The cathode side of the power source 44 (the − side) and the upper electrode 43 are both connected to GND.

As follows is a description of a plating layer formation step that utilizes the type of plating apparatus 40 described above. First, the substrate 10 with the seed layer 14 formed thereon and the upper electrode 43 are secured in a state of contact using the holder 46, and the combined structure is then placed in the plating liquid 45. A control device not shown in the drawing is then used to initiate operation of the plating apparatus 40, and apply a voltage from the power source 44 across the upper electrode 43 and the lower electrode 42. On application of this voltage, copper ions (+) within the plating liquid 45 are attracted towards the seed layer 14 of the substrate 10, and by receiving an electron (−), these copper ions are converted to copper metal which adheres to the seed layer 14. This reaction operates continuously, depositing copper metal, and causes the growth of substantially radial shaped deposits of copper metal on top of the seed layer 14, which form the copper metal plating layer 15, as shown in FIG. 1G.

By conducting the plating layer formation step described above, the plating layer 15 can be formed in positions corresponding with the seed layer 14 formed on the lyophilic sections 12.

Furthermore, the seed layer 14 and the plating layer 15 are formed using the same copper material, and consequently not only can a low resistance metal element be formed, but a metal element of a single material can be formed.

The plating layer formation step for the present embodiment was described in terms of an electroplating process using the apparatus shown in FIG. 4, but the present invention is not restricted to electroplating processes, and electroless plating processes can also be used.

Furthermore, in the above description a copper sulfate based copper electroplating liquid was used as the plating liquid 45, but the present invention is not restricted to this plating liquid, and any type of plating liquid capable of forming the desired plating layer 15 can be used.

(Interlayer Insulating Film Formation Step)

Figure 2A:
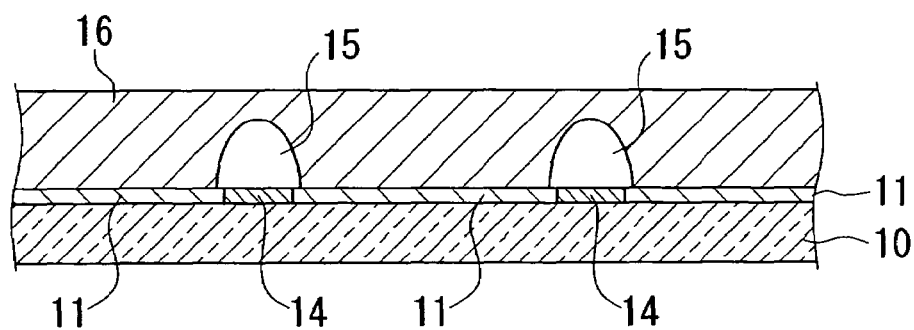
FIGS. 2A and 2B are schematic cross sectional views of a substrate describing a metal element formation method of the present invention.
Figure 5A:
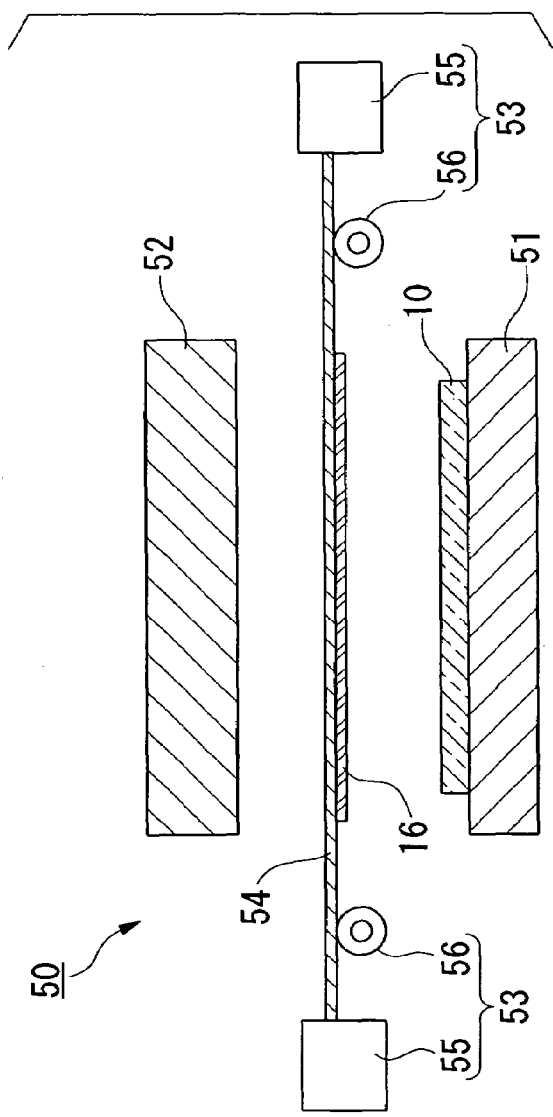
FIGS. 5A and 5B are schematic cross sectional views of a crimping apparatus used in an interlayer insulating film formation method.

In the interlayer insulating film formation step, a crimping apparatus shown in FIG. 5A is used to form an interlayer insulating film (an insulating film) 16 shown in FIG. 2A.

The crimping apparatus 50 is an apparatus used for transferring a layer formed as a thin film onto the substrate 10, and comprises a fixed stage 51, a transfer plate 52, a film support mechanism 53, and a film 54. In the example shown, the transfer plate 52 is able to be driven up and down using a drive mechanism that is not shown in the drawing. Furthermore, the fixed stage 51 and the transfer plate 52 are equipped with a heating device that enables the substrate 10 and the film 54 to be heated to a desired level. The film support mechanism 53 comprises a tension mechanism 55 and a rotational axis 56, and is designed to support the film 54.

Furthermore, the film 54 is a thermoplastic resin film, and is provided with an interlayer insulating film 16 on the side of the film that opposes the substrate 10. This interlayer insulating film 16 is formed by applying a liquid material uniformly onto the film 54, and then drying the liquid material.

In this embodiment, the interlayer insulating film 16 is formed using an application liquid that forms a silica based insulating film, comprising either one, or a plurality of polysilazanes of the SOG material represented by a formula 1 shown below. In the formula 1, the groups R1, R2 and R3 each represent, independently, a hydrogen atom, or an alkyl group, aryl group or alkoxyl group of 1 to 8 carbon atoms.

[Formula 1]

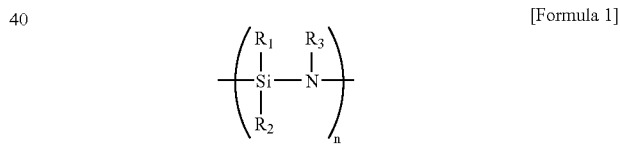

Figure 5B:
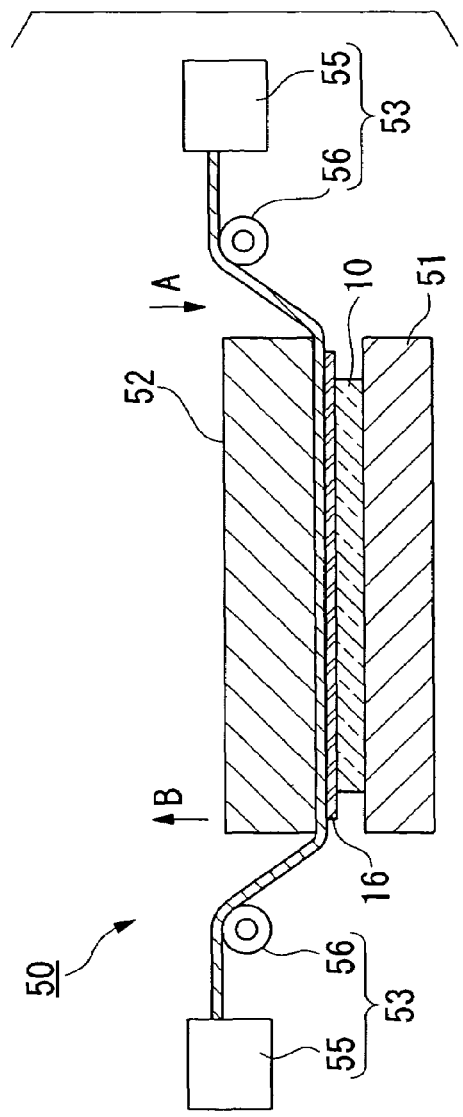

Next is a description an interlayer insulating film formation step using the crimping apparatus 50 described above. With the substrate 10 mounted on the fixed stage 51, the film 54 is positioned so that the substrate 10 and the interlayer insulating film 16 are opposing each other, the film support mechanism 53 is used to apply a predetermined level of tension to the film 54, and the heating device is used to heat the fixed stage 51 and the transfer plate 52 to a predetermined temperature. The drive mechanism then drives the transfer plate 52 in the direction of the arrow A, as shown in FIG. 5B, and the driving of the transfer plate 52 brings the interlayer insulating film 16 and the substrate 10 into contact, and then crimps them together. By subsequently stretching the film 54 with the film support mechanism 53 and driving the transfer plate 52 in the direction of the arrow B, the interlayer insulating film 16 is separated from the film 54 and is transferred to the substrate 10 as shown in FIG. 2A.

By conducting the interlayer insulating film formation step described above, an interlayer insulating film 16 can be formed easily on a substrate 10 on which a plating layer 15 has already been formed.

The operation of the crimping apparatus 50 is preferably conducted under vacuum conditions. By carrying out this step under vacuum conditions, the entrapment of gas bubbles between the interlayer insulating film 16 and the substrate 10 can be prevented.

Furthermore, in the present embodiment, an interlayer insulating film was described as the insulating film, but there are no particular restrictions on the insulating film, provided a film with electrical insulation properties is obtained.

Furthermore, so-called low-k materials may also be used as the insulating film material.

(Etching Step)

Figure 2B:
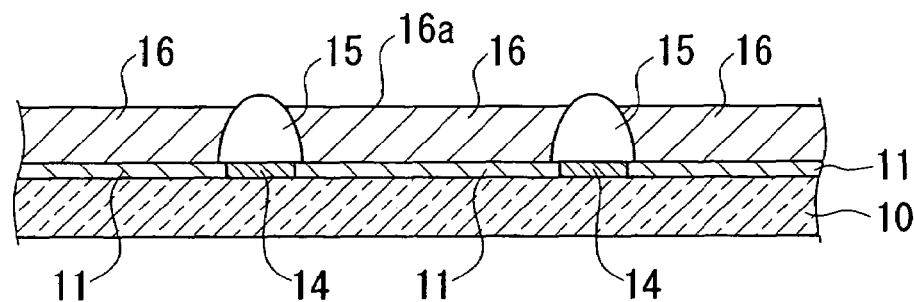

The etching step can utilize either a dry etching process or a wet etching process. In this process, a portion of the interlayer insulating film 16 is removed, thereby exposing the plating layer 15 through the upper surface 16a of the interlayer insulating film 16, as shown in FIG. 2B.

By conducting this type of etching step, a CMP process becomes unnecessary, meaning the overall process can be simplified, and production costs can be reduced.

Furthermore, in a conventional CMP process, a comparatively hard material such as $SiO_2$ is required as the insulating film, whereas in the present invention, because the CMP step becomes unnecessary, there is no need to restrict the material of the insulating film in this manner, meaning the degree of freedom in selecting the insulating film material is increased significantly. For example, if materials with low dielectric constants, so-called low-k materials, are selected, then because there is no necessity to use a hard material, the ideal material can be selected.

In addition, with the plating layer 15 exposed, by then repeating the seed layer formation step, the plating layer formation step, and the interlayer insulating film formation step, a layered metal element structure can be formed. Furthermore, during formation of such a layered structure, a mask 13 of the desired pattern is used each time lyophilic sections 12 are formed.

(Second Embodiment)

As follows is a description of a second embodiment of a metal element formation method according to the present invention.

In this embodiment, the seed layer formation step and the plating layer formation step are different from those of the first embodiment. In the first embodiment, the seed layer 14 was formed on lyophilic sections 12 on the substrate 10, whereas in this second embodiment, concave sections are provided on the substrate 10, the seed layer is formed inside these concave sections, and then the plating layer is also formed inside the concave sections.

Only those areas of this embodiment that differ from the first embodiment are described below. Components that are the same as the first embodiment are labeled with the same symbols, and their descriptions are omitted.

Figure 6A:
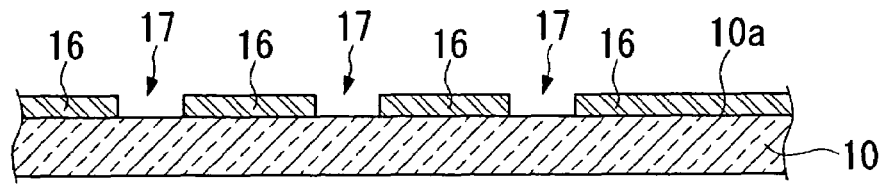
FIGS. 6A to 6F are schematic cross sectional views of a substrate describing a second embodiment of the present invention.

As shown in FIG. 6A, an interlayer insulating film 16 is first formed on the treatment surface 10a of the substrate 10, and patterning of this interlayer insulating film 16 is then conducted to form a series of concave sections 17. The concave sections 17 can be formed by a variety of different processes including a process in which photolithography is used to remove portions of the interlayer insulating film 16, or a process in which a liquid phase method is used to form convex sections of the interlayer insulating film 16 in the lyophilic regions, and relative concave sections are then formed within these convex sections.

(Seed Layer Formation Step)

The seed layer formation step of this embodiment comprises a liquid repellent section formation step and a film formation step, as shown in FIG. 6B through FIG. 6F.

Figure 6B:
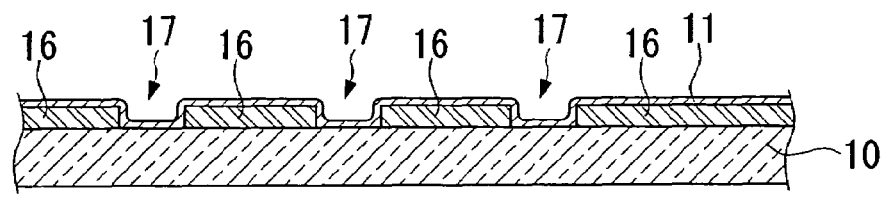

First, as shown in FIG. 6B, a liquid repellent section formation step is conducted in the same manner as the first embodiment, forming a liquid repellent section 11 on the surface of the interlayer insulating film 16.

Figure 6C:
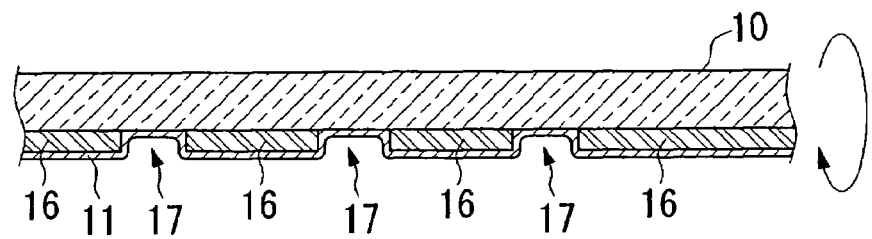

Next, as shown in FIG. 6C, the substrate 10 is inverted using a conveyance device not shown in the drawings, so that the concave sections 17 are positioned facing downwards.

Figure 6D:
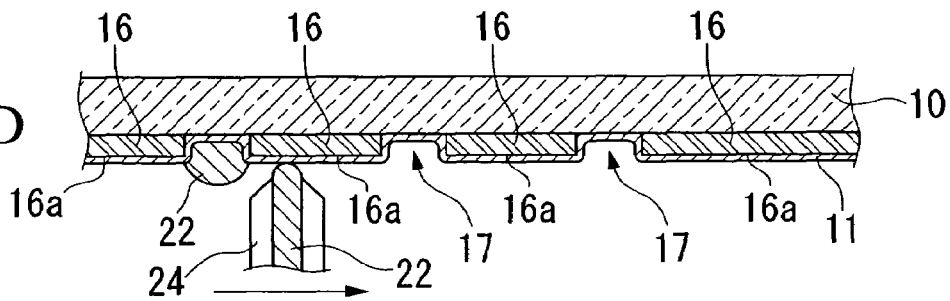

Subsequently, a film formation step is carried out as shown in FIG. 6D, using the slit coating process shown in FIG. 3B that utilizes capillary action. The material for the liquid material 22 is the same material as that used for the first embodiment.

In other words, the slit coating process is used to move the substrate 10 and the slit section 24 relative to each other, while a predetermined distance is maintained between the opening of the slit section 24 and the surface 16a of the interlayer insulating film 16. When the slit section 24 reaches the vicinity of a concave section 17, the liquid material 22 at the tip of the slit section 24 flows into the concave section 17, dissolving the gas present within the concave section 17, so that the concave section 17 is filled with the liquid material 22, and the gas within the concave section 17 is expelled externally. In other words, by using this type of slit coating process, the gas inside the concave section 17 can be replaced with the liquid material 22.

Figure 6E:
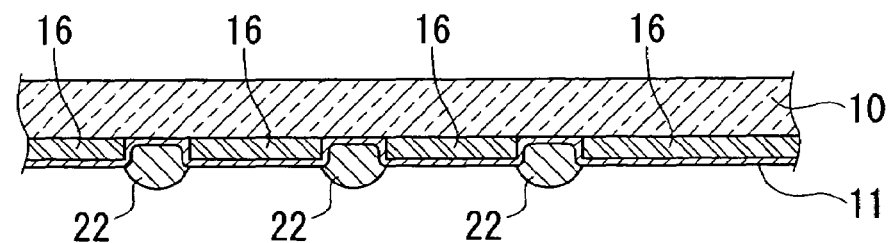

In addition, by maintaining continuous relative movement of the substrate 10 and the slit section 24, the liquid material 22 can be used to rapidly fill all of the concave sections 17, as shown in FIG. 6E.

Furthermore, because the liquid repellent section 11 is formed on those areas of the surface 16a of the interlayer insulating film 16 outside the concave sections 17, liquid material 22 that adheres to the surface 16a does not collect there, but rather flows into the concave sections 17, enabling the liquid material 22 to be confined within the concave sections 17.

In the present embodiment, the replacement action described above enables the liquid material 22 to fill the concave sections 17 formed in the liquid repellent section 11, but in those cases in which the aspect ratio of the concave sections 17 is greater than a predetermined value, the liquid material 22 can be used to fill the concave sections 17 even without a liquid repellent section 11. In such cases, in order to prevent the liquid material 22 collecting on areas outside the concave sections 17, a liquid discharge process can be used while the concave sections 17 are still facing upwards as shown in FIG. 6B, and the positions of liquid discharge are preferably controlled so that the liquid material 22 is filled only inside the concave sections 17.

Figure 6F:
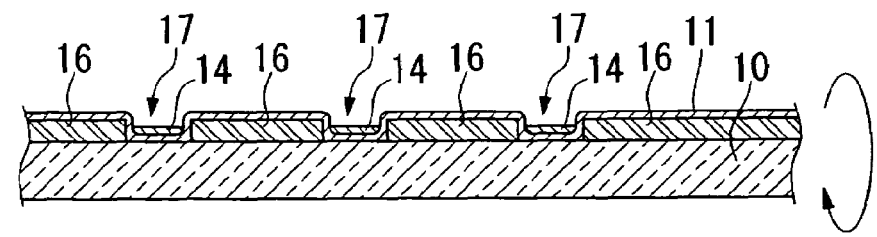

Subsequently, the substrate 10 is inverted once again, and following equalization of the concentration distribution of the liquid material 22 in the same manner as the first embodiment, a drying treatment and then a heat treatment are carried out, thereby firing the fine metal particles, and forming the copper metal seed layer 14 shown in FIG. 6F. That is, the seed layer 14 is formed only inside the concave sections 17.

(Plating Layer Formation Step)

The plating layer formation step of this embodiment uses the plating apparatus shown in FIG. 4, in the same manner as the first embodiment, and forms a plating layer 15 on the seed layer 14 within the concave sections 17.

Figure 7:
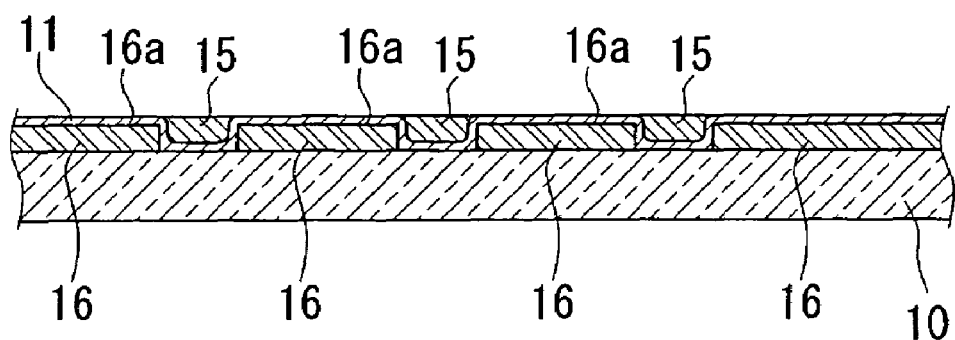
FIG. 7 is a schematic cross sectional view of a substrate describing a second embodiment of the present invention.

In other words, by continuously depositing copper metal onto the inner surface of the concave sections 17, the plating layer 15 can be formed so as to embed the concave sections 17, as shown in FIG. 7, and the direction of the growth of the plating layer 15 accompanying the copper metal deposition can be regulated. Because the plating layer 15 is exposed through the surface 16a of the interlayer insulating film 16, a CMP process is unnecessary, enabling a simplification of the overall process, and a reduction in production costs.

(Third Embodiment)

As follows is a description of a third embodiment of a metal element formation method according to the present invention.

This embodiment differs from the previous embodiment only in terms of the seed layer formation step. In the second embodiment, the seed layer was formed inside concave sections in the interlayer insulating film, whereas in this third embodiment, the seed layer is formed inside concave sections in a resist layer.

Only those areas of this embodiment that differ from the previous embodiments are described below. Components that are the same as the previous embodiments are labeled with the same symbols, and their descriptions are omitted.

Figure 8A:
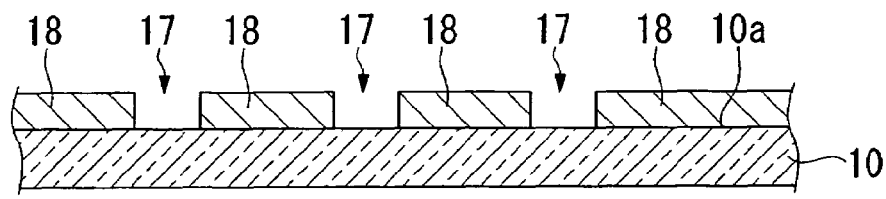
FIGS. 8A to 8D are schematic cross sectional views of a substrate describing a third embodiment of the present invention.

As shown in FIG. 8A, a resist layer 18 is formed on the treatment surface 10a of the substrate 10, and patterning of this resist layer 18 is then conducted to form a series of concave sections 17. The concave sections 17 can be formed by a variety of different processes including a process in which portions of the resist layer 18 are removed by exposure and subsequent development, or a process in which a liquid phase method is used to form convex sections of the resist layer 18 in the lyophilic regions, and relative concave sections are then formed within these convex sections. The resist layer 18 is formed from a liquid repellent resist.

(Seed Layer Formation Step)

Figure 8B:
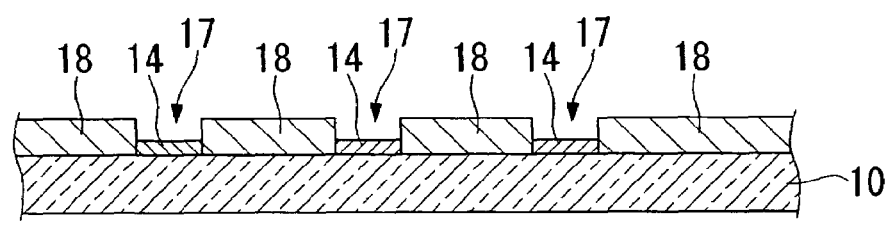

First, as shown in FIG. 8B, a film formation step is conducted in the same manner as the second embodiment, thereby filling the concave sections 17 with the liquid material 22, and once the concentration distribution of the liquid material 22 has been equalized, a drying treatment and heat treatment are carried out to complete formation of the seed layer 14. In this embodiment, because the resist layer 18 is formed from a liquid repellent resist, liquid material 22 that adheres to areas outside the concave sections 17 does not collect there, but rather flows into the concave sections 17, enabling the liquid material 22 to be confined within the concave sections 17. Furthermore, this embodiment also omits the liquid repellent section formation step, enabling a further simplification of the overall process, and a reduction in production costs.

(Resist Removal Step)

Figure 8C:
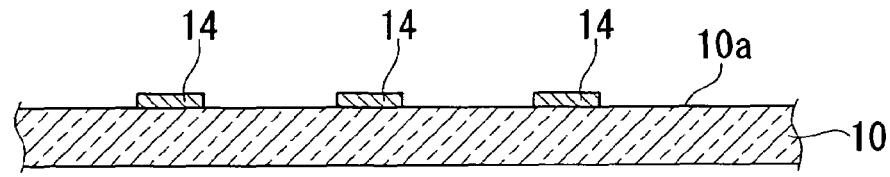

Subsequently, a resist removal process is conducted, as shown in FIG. 8C, and the entire resist layer 18 is removed, leaving only the seed layer 14 on the treatment surface 10a of the substrate 10. Either dry ashing or wet ashing processes can be used for this resist removal step. In a dry ashing process, an $O_2$ plasma is used in a vacuum atmosphere, whereas in a wet ashing process, a resist removal liquid is used.

(Plating Layer Formation Step, Interlayer Insulating Film Formation Step, Etching Step)

Figure 8D:
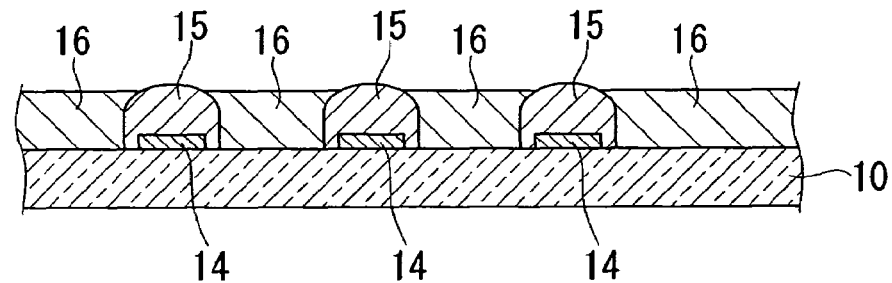

Next, as shown in FIG. 8D, a plating layer formation step, an interlayer insulating film formation step, and an etching step are carried out sequentially in the same manner as the first embodiment. In other words, a plating layer 15 is formed on the seed layer 14 using a plating method, an interlayer insulating film 16 is transferred using the crimping apparatus 50 so as to cover the plating layer 15, and then a portion of the interlayer insulating film 16 is removed by an etching method. This provides the same effects as those described for the previous embodiments.

In those cases where the resist layer 18 is formed by forming a resist layer 18 across the entire substrate 10, followed by patterning of the resist layer 18 through an exposure process, the subsequently formed seed layer 14 and the plating layer 15 can be formed using the same pattern as the exposure mask.

Furthermore, in those cases where a liquid discharge method or the like is used to discharge the resist onto the substrate 10 in a predetermined pattern, thereby forming a convex shaped resist layer 18, the seed layer 14 and the plating layer 15 can be formed inside the relative concave sections 17 formed within the convex shaped resist layer. In such cases, the liquid discharge method is conducted on the basis of an electronic data pattern, and as a result, an exposure mask is unnecessary, and seed layers and plating layers of any pattern can be formed.

(Fourth Embodiment)

As follows is a description of a fourth embodiment of a metal element formation method according to the present invention.

This embodiment differs from the previous embodiment in terms of the seed layer formation step, the plating layer formation step, and the interlayer insulating film formation step. In the third embodiment, the seed layer was formed inside concave sections in a single resist layer, and the plating layer was then formed on this seed layer, whereas in this fourth embodiment, a plurality of resist layers are used to form an open wiring structure. Furthermore, whereas a crimping apparatus was used in the interlayer insulating film formation step of the previous embodiment, in this embodiment a liquid phase method is used.

Only those areas of this embodiment that differ from the previous embodiments are described below. Components that are the same as the previous embodiments are labeled with the same symbols, and their descriptions are omitted.

Figure 9A:
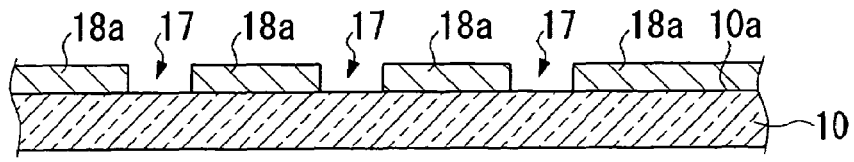
FIGS. 9A to 9G are schematic cross sectional views of a substrate describing a fourth embodiment of the present invention.

As shown in FIG. 9A, a first resist layer (a resist layer) 18a is formed on the treatment surface 10a of the substrate 10 in the same manner as the third embodiment, and this first resist layer 18a is then patterned to form concave sections 17.

(First Seed Layer Formation Step, First Plating Layer Formation Step)

Figure 9B:
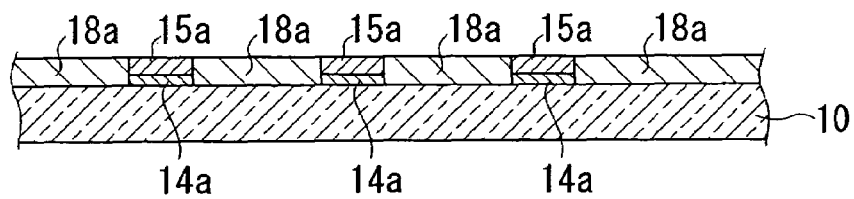

First, as shown in FIG. 9B, a first seed layer formation step (a seed layer formation step) and a first plating layer formation step (a plating layer formation step) are conducted in a similar manner to the previous embodiment, forming a first plating layer (a plating layer) 15a that corresponds with the first seed layer (a seed layer) 14a inside the concave sections 17.

(Resist Layer Formation Step)

Figure 9C:
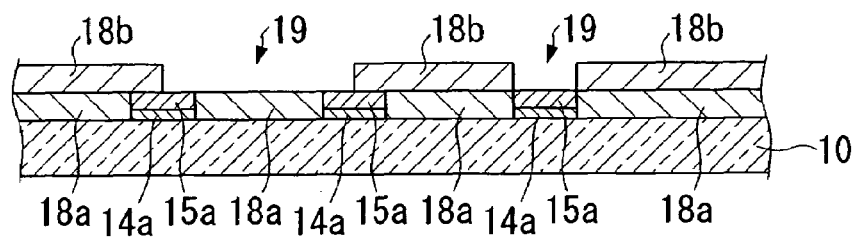

Next, as shown in FIG. 9C, another resist layer formation step is conducted, and a liquid phase method is used to form a second resist layer (a resist layer) 18b of a predetermined pattern. Prior to this formation, the surface of the first resist layer 18a and the first plating layer 15a is preferably subjected to lyophilic treatment and liquid repellent treatment, and in such cases, a liquid phase method can be favorably employed.

By patterning the second resist layer 18b, concave sections 19 are formed that are enclosed by the first and second resist layers 18a, 18b and the first plating layer 15a. Because a liquid phase method is used in subsequent processes, the surfaces of the second resist layer 18b and the first plating layer 15a, including the concave sections 19, are subjected to lyophilic treatment and liquid repellent treatment.

(Second Seed Layer Formation Step, Second Plating Layer Formation Step)

Figure 9D:
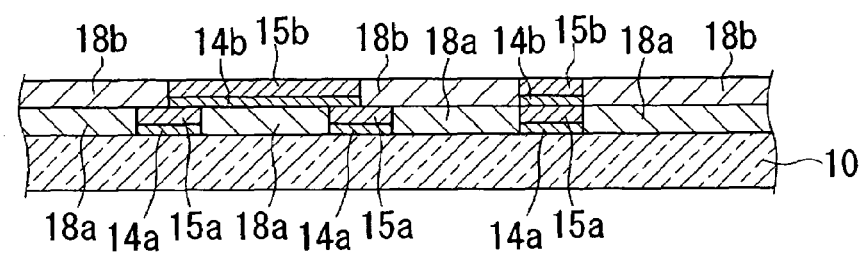

Subsequently, as shown in FIG. 9D, a second seed layer formation step (a seed layer formation step) and a second plating layer formation step (a plating layer formation step) are conducted in a similar manner to that shown in FIG. 9A, thereby forming a second plating layer (a plating layer) 15b that corresponds with the second seed layer (a seed layer) 14b inside the concave sections 19.

In those cases in which the distance to the first plating layer 15a is short, the growth of the second plating layer 15b during the second plating layer formation step causes the second plating layer 15b to contact the corresponding first plating layer 15a, and consequently the second seed layer formation step can be omitted. In other words, depending on the pattern shape, the second seed layer formation step may be able to be omitted.

(Resist Layer Formation Step, Third Seed Layer Formation Step, Third Plating Layer Formation Step)

Figure 9E:
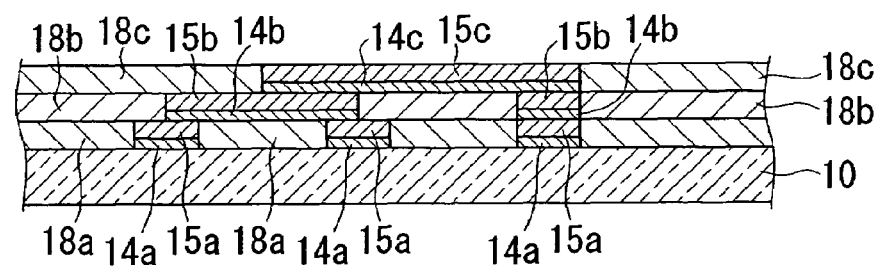

Subsequently, as shown in FIG. 9E, a third resist layer (a resist layer) 18c, a third seed layer (a seed layer) 14c, and a third plating layer (a plating layer) 15c are formed.

These formation steps are conducted in a similar manner to the resist layer formation step, the second seed layer formation step, and the second plating layer formation step described in FIG. 9C and FIG. 9D, and as such, their description is omitted here.

(Resist Removal Step)

Figure 9F:
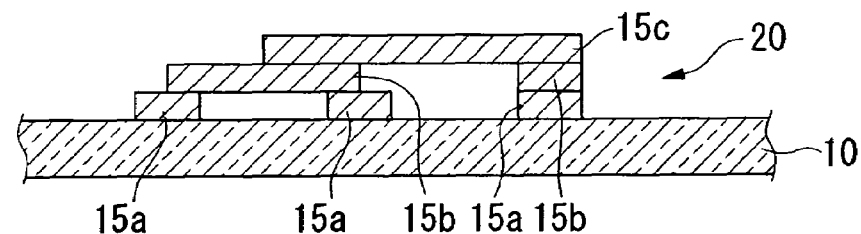

Next, as shown in FIG. 9F, a resist removal step is conducted in a similar manner to that described in the third embodiment, thereby removing the first resist layer 18a, the second resist layer 18b, and the third resist layer 18c, leaving only the first plating layer 15a, the second plating layer 15b, and the third plating layer 15c on top of the substrate 10, and forming an open wiring structure 20. In FIG. 9F, the first seed layer 14a, the second seed layer 14b and the third seed layer 14c are not shown.

As described above, because the resist layer can be removed after formation of the plating layer, a multilayer metal element can be formed and the resist layers then removed in a subsequent process, enabling the formation of a multilayer metal element, or a so-called open wiring structure.

This embodiment is not restricted to the formation of open wiring structures, and also enables easy formation of three dimensional patterns.

(Interlayer Insulating Film Formation Step)

In an interlayer insulating film formation step of this embodiment, a liquid phase method is used to form an interlayer insulating film 16 that embeds the open wiring structure 20, and this liquid phase method employs a dip coating process. The liquid material uses the same application liquid that was used for forming a silica based insulating film described in the first embodiment.

Figure 9G:
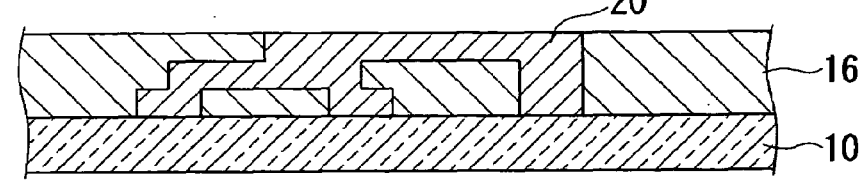

Furthermore, in this interlayer insulating film formation step, following application of the liquid material 22 by dip coating, the substrate 10 is exposed to a saturated vapor pressure atmosphere and held for a predetermined period of time, so that the liquid material does not dry out, and the concentration distribution within the liquid material can be satisfactorily equalized. The substrate 10 is then placed in a baking furnace or the like, and the solvent contained within the liquid material is removed via a drying treatment, thereby forming the interlayer insulating film 16 shown in FIG. 9G.

By using a liquid phase method as described above, the liquid material can flow right into the corners of three dimensional patterns such as the open wiring structure 20, enabling the interlayer insulating film to be formed embedded around the three dimensional pattern.

Furthermore, comparing the above liquid phase formation method for an interlayer insulating film with the formation method for multilayer interlayer insulating films, the above liquid phase method does not require the formation of an etching stop layer to prevent etching, and the interlayer insulating film can be formed in a single batch. In other words, compared with other methods, the liquid phase method enables a simplification of the overall method, and a reduction in production costs.

The liquid phase method is not restricted to dip coating, and any of the variety of methods described in the above embodiments can be favorably employed.

(Fifth Embodiment)

As follows is a description of a fifth embodiment of a metal element formation method according to the present invention.

In the previous embodiment, the seed layer and the plating layer were formed using the same metal, whereas in this fifth embodiment, selected different metals are used.

Only those areas of this embodiment that differ from the previous embodiments are described below. Components that are the same as the previous embodiments are labeled with the same symbols, and their descriptions are omitted.

In this embodiment, fine particles of silver are used during the seed layer formation step, whereas in the plating layer formation step, the same copper sulfate based copper electroplating liquid as the previous embodiments is used. Accordingly, by carrying out the seed layer formation step and the plating layer formation step, the seed layer 14 and the plating layer 15 are formed of different materials.

Because silver is more resistant to oxidation than copper, the seed layer 14 of this embodiment displays a greater resistance to oxidation than the embodiments described above.

Gold may also be used instead of silver, and produces a similar effect.

Next is a description of a modification of the fifth embodiment.

In this modification, a circuit board with an electrode on the surface is used as the substrate 10, and the seed layer 14 and the plating layer 15 are formed on this electrode. Fine particles of titanium are used in the seed layer formation step, whereas in the plating layer formation step, the same copper sulfate based copper electroplating liquid as the previous embodiment is used. Titanium is widely known as a material with a so-called protective function, which suppresses the generation of voids in the aluminum wiring of electronic devices and the like.

Accordingly, by forming a seed layer 14 of titanium between the substrate 10 and the plating layer 15, the seed layer 14 takes on the function of a barrier layer, preventing the diffusion of metal into the substrate. In other words, abnormalities within the substrate 10 resulting from diffusion of the plating layer metal can be largely inhibited.

Tungsten may also be used instead of titanium as the material that functions as a barrier layer, and produces a similar effect.

(Sixth Embodiment)

As follows is a description of a sixth embodiment of a metal element formation method according to the present invention.

This embodiment differs from the previous embodiment in terms of the seed layer formation step and the plating layer formation step, although once again, the seed layer and the plating layer are formed from different metals. In addition, an electroless plating process is used for the plating layer formation step.

Only those areas of this embodiment that differ from the previous embodiments are described below. Components that are the same as the previous embodiments are labeled with the same symbols, and their descriptions are omitted.

(Seed Layer Formation Step)

The seed layer formation step of this embodiment comprises a first film formation step (a film formation step) and a second film formation step (a film formation step).

The first film formation step involves conducting a liquid phase method using a liquid material 22, and a drying treatment or heat treatment, in a similar manner to previous embodiments, and by completing this first film formation step, the metal contained within the liquid material 22 is deposited, increasing the sensitivity towards an electroless plating liquid. A tin chloride solution is used as the liquid material 22, although the liquid material is not restricted to a tin chloride solution, and any solution that produces good adhesion to the substrate 10 can be used. For example, a zinc chloride solution may also be used.

Furthermore, the second film formation step is a step in which by conducting a liquid phase method using a solution of palladium chloride, and a subsequent drying treatment or heat treatment, a catalyst can be supplied to the metal deposited during the first film formation step. This catalyst refers to a material that accelerates the reduction reaction of the following electroless plating process. The catalyst is not restricted to a palladium chloride solution, and any of a variety of catalytic metal solutions can be used.

Needless to say, prior to carrying out these first and second film formation steps, either a liquid repellent section formation step and a lyophilic section formation step are conducted in advance, or concave sections 17 are formed on the substrate 10, in the same manner as described in the previous embodiments.

By conducting the plating layer formation step described above, a seed layer 14 is formed comprising tin metal that offers increased sensitivity towards an electroless plating liquid, and palladium metal that acts as a catalyst for the tin.

(Plating Layer Formation Step)

The plating layer formation step of this embodiment uses an electroless plating process. Because a low resistance material is desirable as the plating layer 15, any of a variety of electroless plating liquids comprising copper metal can be used, and a solution of copper chloride is particularly suitable.

By immersing the substrate 10 on which the above seed layer 14 has been formed in the electroless plating liquid, a reduction reaction within the electroless plating liquid causes the copper metal within the electroless plating liquid to adhere to the seed layer 14, and by continuous operation of this reduction reaction, copper metal is deposited, forming a plating layer 15.

According to the present embodiment, the plating layer 15 can be formed using an electroless plating method. Furthermore, the seed layer 14 and the plating layer 15 are formed from different metals, and hence this embodiment produces similar effects to the fifth embodiment.

(Seventh Embodiment)

As follows is a description of a seventh embodiment of a metal element formation method according to the present invention.

This embodiment describes the materials in the case in which an organocopper compound is used in the seed layer formation step.

Only those areas of this embodiment that differ from the previous embodiments are described below. Components that are the same as the previous embodiments are labeled with the same symbols, and their descriptions are omitted.

The chemical formulas from formula 2 through formula 28 shown below represent organocopper compounds that can be used in this embodiment. The names for each of the chemical formulas are listed below.

Figure 14:
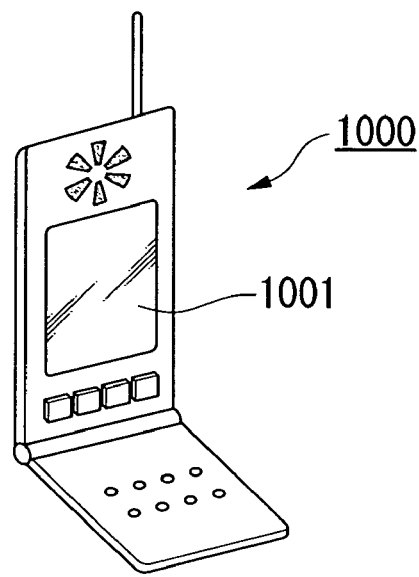
FIG. 14 is a diagram showing one example of a piece of electronic equipment equipped with a semiconductor device of the present invention.

Namely, formula 2 is copper acetate, formula 3 is allyloxyethoxyfluoroacetoacetato copper, formula 4 is benzoacetonato copper phenylbutanedionate, formula 5 is benzoyltrifluoroacetonato copper BTA, formula 6 is dimethylamino copper ethoxide, formula 7 is copper dimethyldithiocarbamate, formula 8 is 1,3-diphenyl-1,3-propanedionato bisdibenzoylmethanato copper, formula 9 is copper ethoxide, formula 10 is copper ethylacetoacetate, formula 11 is copper 2-ethylhexanoate, formula 12 is copper formate tetrahydrate, formula 13 is 6,6,7,7,8,8,8-heptafluoro-2,2-dimethyl-3,5-octadionato copper, FIG. 14 is hexafluoropentanedione-2-dibutyne copper, formula 15 is hexafluoropentanedionato cyclooctadiene copper, formula 16 is hexafluoropentanedionato vinyltrimethylsilane copper, formula 17 is hexafluoropentanedionato copper, formula 18 is copper 8-hydroxyquinolinate, formula 19 is copper methacrylate, FIG. 20 is copper methacryloxyethylacetate, formula 21 is copper methoxide, formula 22 is copper methoxyethoxyethoxide, formula 23 is 2,4-pentanedionato copper, formula 24 is copper phthalocyanine, formula 25 is 2,2,6,6-tetramethyl-3,5-heptanedionato copper, formula 26 is copper trifluoroacetate, formula 27 is trifluoropentanedionato copper, and formula 28 is trifluoromethanesulfone copper triflate.

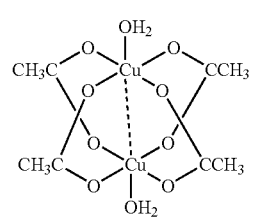

[Formula 2]

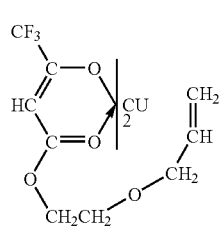

[Formula 3]

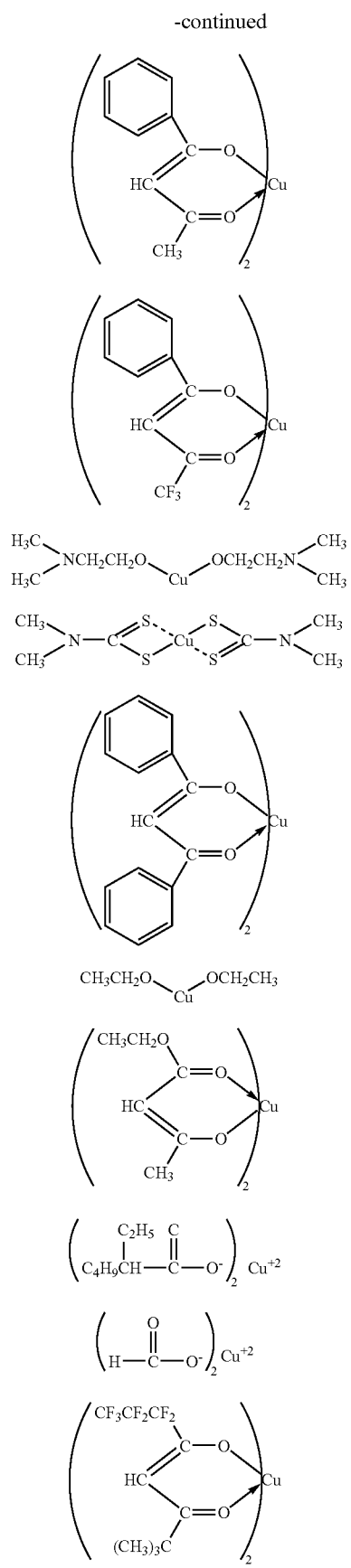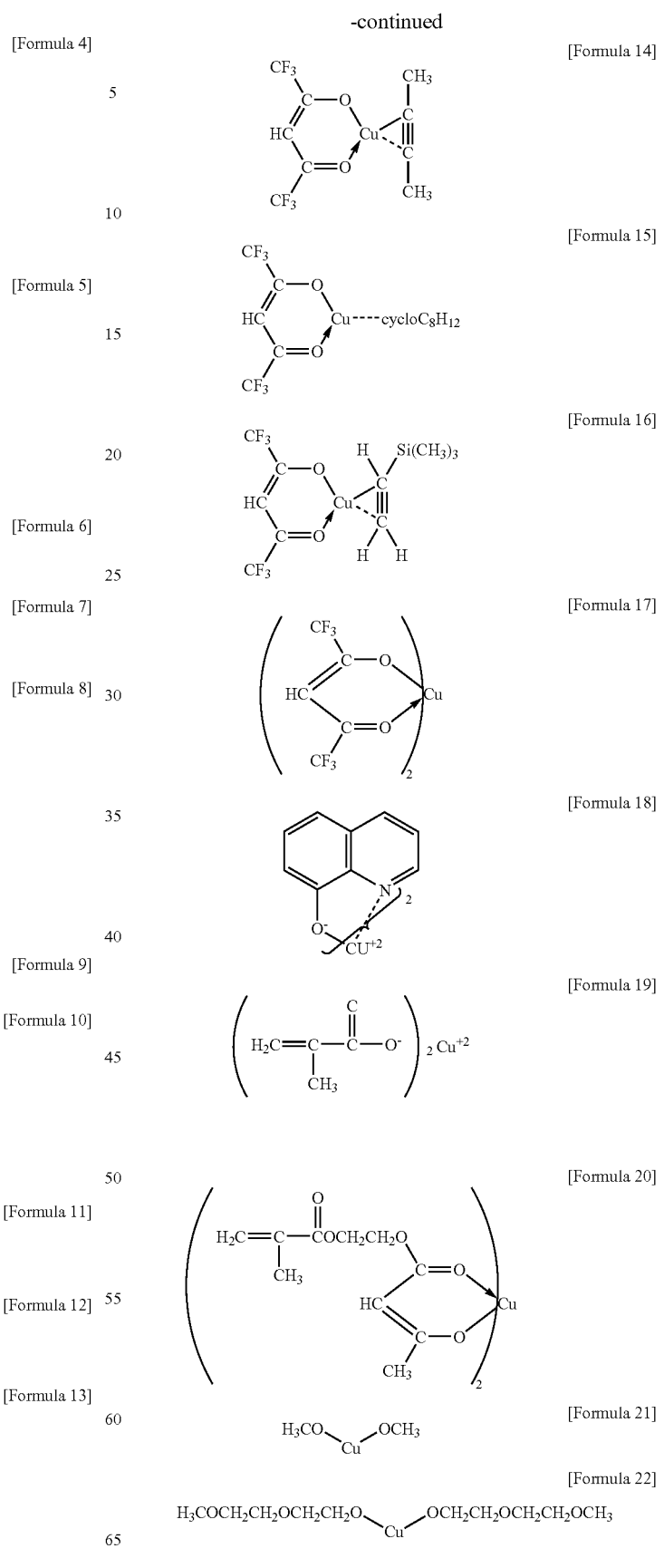

-continued

[Formula 23]
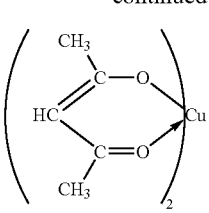

[Formula 24]
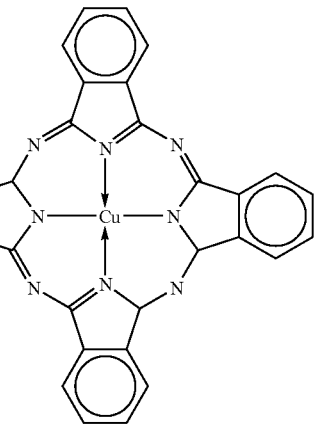

[Formula 25]
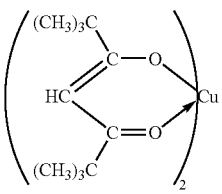

[Formula 26]
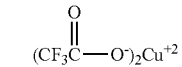

[Formula 27]
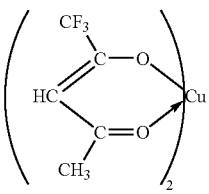

[Formula 28]
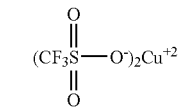

The above organocopper compounds do not display conductivity themselves, but gain conductive characteristics similar to those of copper when subjected to firing under heat treatment.

To form the seed layer 14 using such an organocopper compound, the compound is dissolved in a solvent such as toluene, and then using a similar liquid phase method to the previous embodiments, the liquid material is applied, the concentration is equalized, and the liquid is then subjected to a drying treatment and heat treatment, thereby evaporating the toluene, firing the organic compound, and forming a seed layer with the desired level of conductivity.

Furthermore, comparing the fine metal particles of the previous embodiments with the organocopper compounds of this embodiment, it is evident that in the fine metal particles, individual particles exist in a state of point contact, with voids existing in the spaces between particles, whereas in the organic compound, a portion of the organic matter remains in the space between particles.

According to this invention, not only can a low resistance metal seed layer be formed, but a more dense layer can be formed than that which is possible using fine metal particles.

(Eighth Embodiment)

Figure 10:
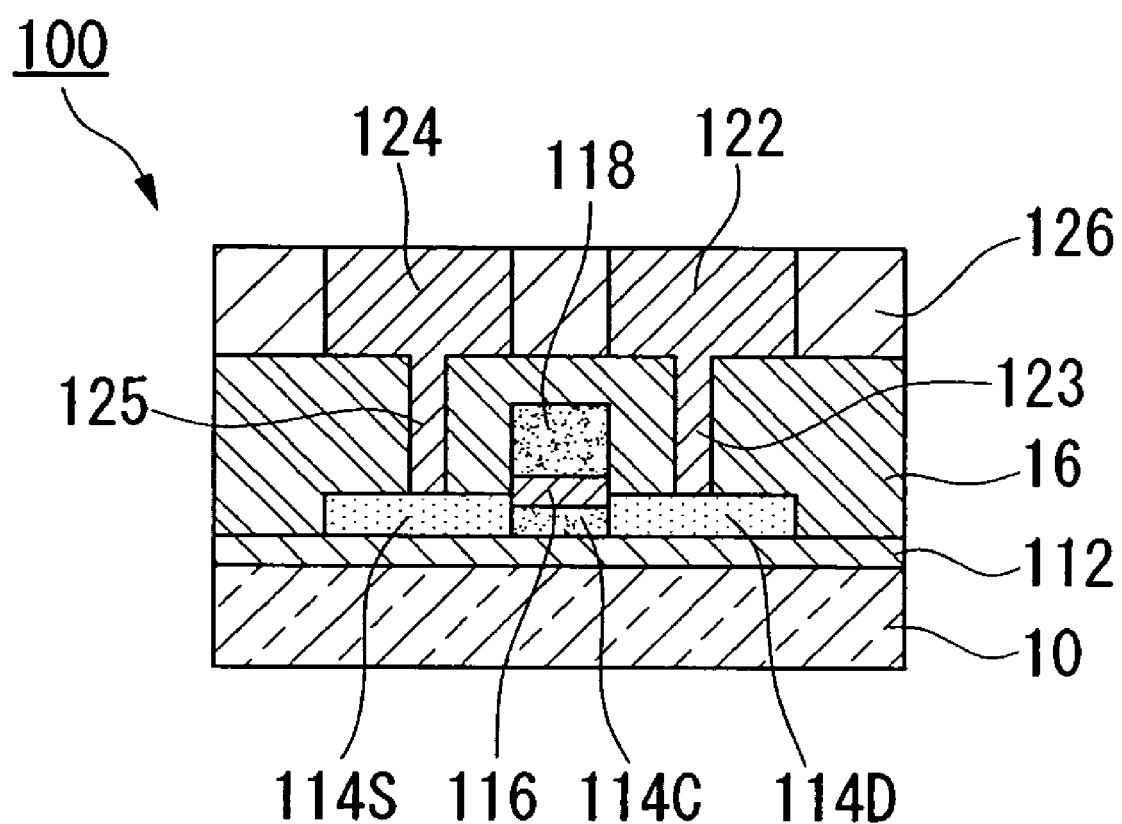
FIG. 10 is a schematic cross sectional view of a semiconductor device of the present invention.

As follows is a description of a semiconductor device and a production method for a semiconductor device that utilize a metal element formation method according to one of the first through seventh embodiments described above, with reference to FIG. 10, FIG. 11A to FIG. 11E, and FIG. 12A to FIG. 12C. FIG. 10 is a cross sectional view showing a transistor (a semiconductor device) using a coplanar type polysilicon as an example of the basic structure of a semiconductor device.

Only those areas of this embodiment that differ from the previous embodiments are described below. Components that are the same as the previous embodiments are labeled with the same symbols, and their descriptions are omitted.

(Transistor)

In FIG. 10, a backing insulating film 112 is formed on a glass substrate (a substrate) 10, and a transistor 100 is then formed on top of the insulating film 112. A silicon film 114 comprises a source region 114S in which atoms of an impurity have been diffused within the silicon film 114, a drain region 114D, and a channel region 114C positioned between the source region 114S and the drain region 114D.

In addition, a gate insulating film 116 is formed on top of the channel region 114C, and a gate electrode 118 is formed on top of the gate insulating film 116. A drain electrode (a plating layer, electrode) 122 is connected to the drain region 114D via drain wiring (a plating layer, wiring) 123 formed in an opening of the interlayer insulating film 16. Similarly, a source electrode (a plating layer, electrode) 124 is connected to the source region 114S via source wiring (a plating layer, wiring) 125 formed in another opening of the interlayer insulating film 16. Furthermore, a second interlayer insulating film (an interlayer insulating film) 126 is formed as the uppermost layer. The backing insulating film 112 is used to prevent contamination from the glass substrate 10, and prepare the surface for formation of the silicon film 114, but may be omitted on occasion.

FIG. 10 shows the basic structure of a transistor, although there are a multitude of potential variations to the transistor structure depending on the type of device. For example, in the case of a coplanar type TFT used for the drive circuit of a display device or the like, an interlayer insulating film is provided between the drain electrode 122 and the source electrode 124 in order to raise the numerical aperture of the display, and the distance between the drain electrode 122 and the source electrode 124 can be narrowed. Alternatively, in order to either decrease the resistance of the gate line (which is not shown in the drawing) connected to the gate electrode 118, or the source line 124, or to increase the redundancy of the wiring, the gate line and the source line 124 can be formed as multilayered films. These types of improved structures invariably require an increase in the number of thin film layers that make up the transistor, when compared with the basic structure of FIG. 10.

(Production Method for Transistor)

Figure 11A:
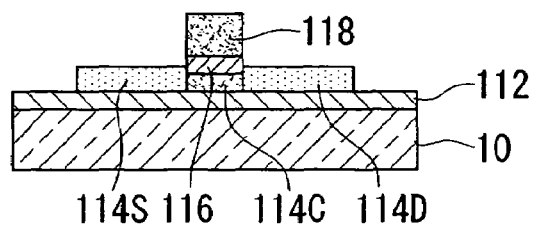
FIGS. 11A to 11E are schematic cross sectional views describing a production method for a semiconductor device according to the present invention.

Next is a description of a production method for the transistor shown in FIG. 10, with reference to FIG. 11A to FIG. 11E, and FIG. 12A to FIG. 12C. In this embodiment, descriptions are given only for the formation of the interlayer insulating film 16, the drain electrode 122, the drain wiring 123, the source electrode 124, and the source wiring 125. As shown in FIG. 11A, the other structural components of the transistor 100 are assumed to have been already formed.

Figure 11B:
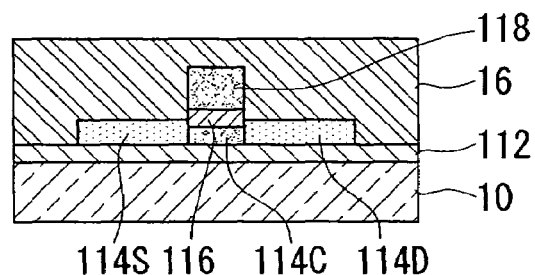

First, as shown in FIG. 11B, the interlayer insulating film 16 is formed so as to cover the gate electrode 118, the drain region 114D, the source region 114S, and the backing insulating film 112. This interlayer insulating film 16 can be formed, for example, by using spin coating to apply a liquid material containing a mixture of a polysilazane and a solvent, and then conducting a heat treatment to transfer the polysilazane to the $SiO_2$. By performing additional heat treatment, a more dense interlayer insulating film 16 can be achieved.

Figure 11C:
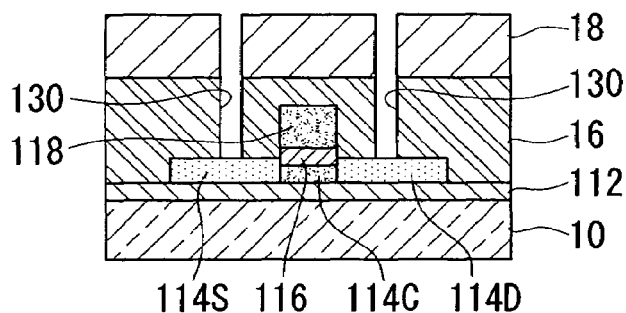

Subsequently, as shown in FIG. 11C, a resist layer 18 that is used for forming contact holes (openings) is formed on top of the interlayer insulating film 16, a predetermined pattern is formed in the resist layer 18, and contact holes 130 are then formed in accordance with that pattern.

The formation method for the resist layer 18 involves applying a resist material to the surface of the interlayer insulating film 16 using spin coating, conducting a masked exposure of this resist material, and then carrying out a development process to form a pattern corresponding with the mask. Here, the term "pattern" refers to the pattern showing the positions of the contact holes 130, as well as the circuit pattern for the drain wiring 123 and the source wiring 125.

The formation method for the contact holes 130 can utilize a variety of different etching processes depending on the structure of the contact holes. For example, dry etching is ideal in those cases in which a vertical structure is required relative to the substrate 10. In such cases, the contact holes 130 must be formed without removing the resist layer 18, and $O_2$ based gases should preferably be avoided. Using this type of process, etching is performed through to the surfaces of the drain region 114D and the source region 114S, thereby opening the contact holes 130.

Figure 11D:
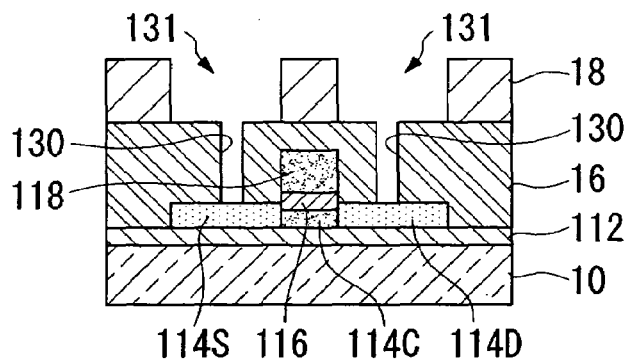

Subsequently, as shown in FIG. 11D, an additional masked exposure and development is conducted on the resist layer 18, forming a pattern that is different from the pattern shown in FIG. 11C. This different pattern is the circuit pattern for subsequent formation of the drain electrode 122 and the source electrode 124, and forms a pattern of concave sections 131 enclosed by the interlayer insulating film 16 and the resist layer 18.

Figure 11E:
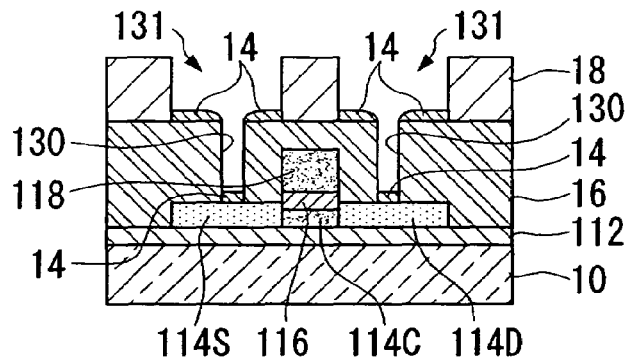

Subsequently, as shown in FIG. 11E, the seed layer formation step described in the previous embodiments is carried out, thereby forming a seed layer 14 inside the contact holes (the concave sections) 130 and the concave sections 131. This produces the same effects as those described in the previous embodiments.

In FIG. 11E, the concave sections 131 have a sufficiently large aspect ratio to enable filling with a liquid material, and also contain corner sections for retaining the liquid through surface tension, thereby enabling formation of the seed layer 14 within the concave sections 131. The description "a sufficiently large aspect ratio to enable filling with a liquid material" means that, as described in the previous embodiments, the aspect ratio is sufficiently large to enable substitution of the gas within the concave sections by the liquid material.

Figure 12A:
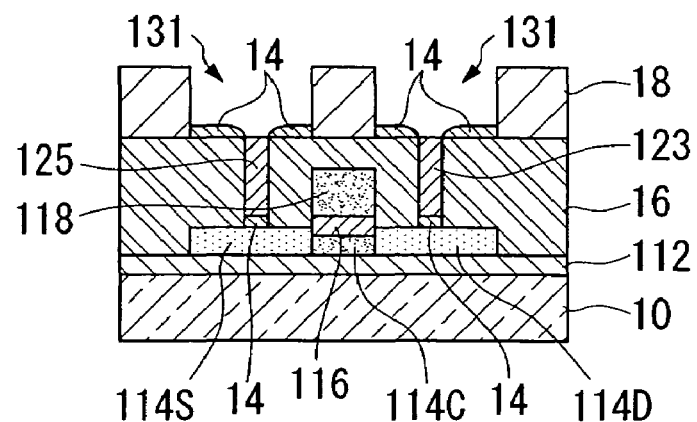
FIGS. 12A to 12C are schematic cross sectional views describing a production method for a semiconductor device according to the present invention.

Next, as shown in FIG. 12A, the plating layer formation step described in the previous embodiments is carried out, thereby forming the drain wiring 123 and the source wiring 125 on top of the seed layer 14 within the contact holes 130. This produces the same effects as those described in the previous embodiments.

Furthermore, the seed layer 14 formed in the concave sections 131 is formed on top of the interlayer insulating film 16, and is not in contact with any electrically conducting members, and consequently the copper ions do not receive electrons (−) within the plating liquid 45. In contrast, the seed layer 14 formed in the contact holes 130 is in contact with the source region 114S and the drain region 114D, and consequently the copper ions receive electrons (−) in the plating liquid 45, and are deposited as copper metal. In other words, only the drain wiring 123 and the source wiring 125 is formed.

Figure 12B:
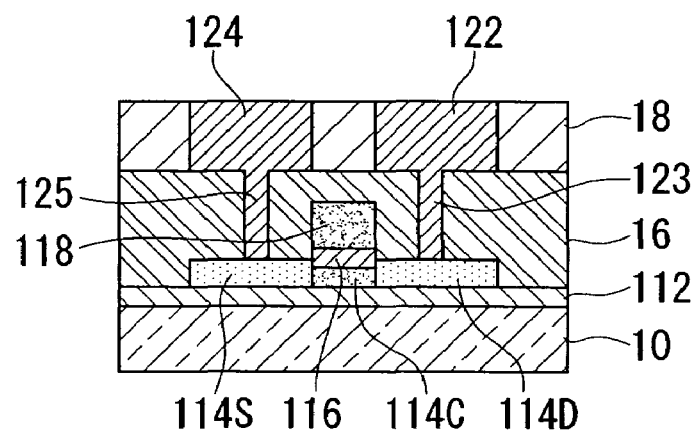

Subsequently, as shown in FIG. 12B, the same plating layer formation step described above is carried out, thereby forming the drain electrode 122 and the source electrode 124 on top of the seed layer 14 within the concave sections 131. This produces the same effects as those described in the previous embodiments.

In the plating liquid 45, copper metal is deposited continuously on the drain wiring 123 and the source wiring 125, and grows substantially radially upward with respect to the interlayer insulating film 16. In addition, as the copper metal grows, it comes into contact with the seed layer 14 of the concave sections 131, thereby creating a state of electrical continuity between the seed layer 14, the drain wiring 123 and the source wiring 125. Accordingly, the copper metal deposits grow so as to embed the concave sections 131, forming the drain electrode 122 and the source electrode 124.

Figure 12C:
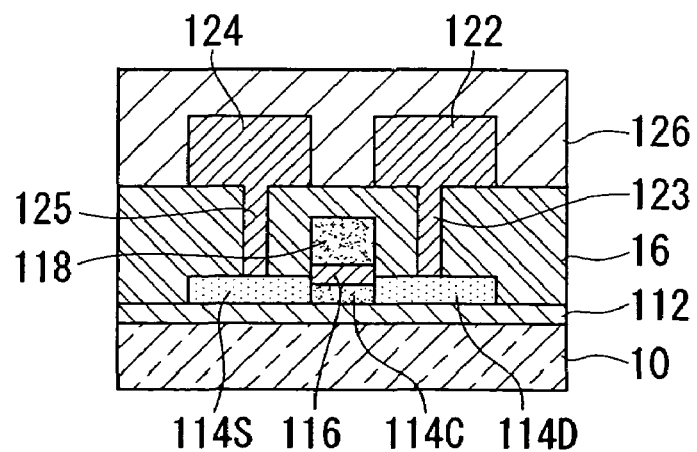

Next, as shown in FIG. 12C, the resist removal step and the interlayer insulating film formation step described in the previous embodiments are carried out, thereby removing the resist layer 18, and subsequently forming a second interlayer insulating film 126 using the crimping apparatus shown in FIG. 5A. This produces the same effects as those described in the previous embodiments.

The material for the second interlayer insulating film 126 utilizes a low-k material. Furthermore, because this process does not require a CMP step, low-k materials are ideal.

By subsequently carrying out the etching step described in the previous embodiments, a portion of the second interlayer insulating film 126 can be removed, exposing the drain electrode 122 and the source electrode 124, and forming the transistor 100 shown in FIG. 10.

As described above, by using the metal element formation method described in the previous embodiments, not only can the transistor 100 be formed, but low-k materials can be selected, meaning the operating frequency of the transistor 100 can be raised.

(Ninth Embodiment)

Figure 13A:
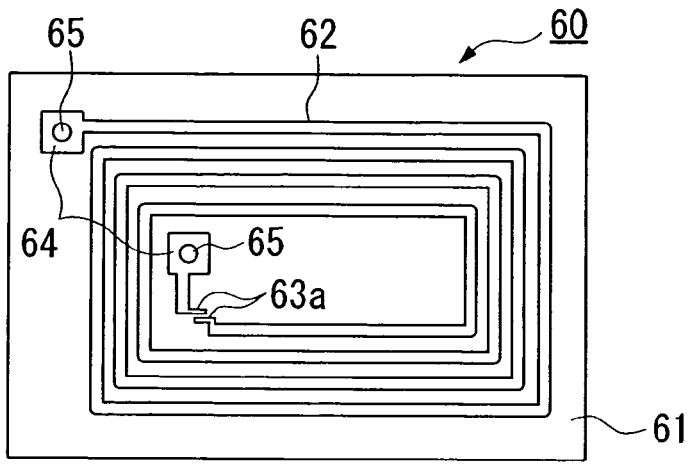
FIGS. 13A to 13F are schematic cross sectional views describing a production method for an electronic device according to the present invention.
Figure 13B:
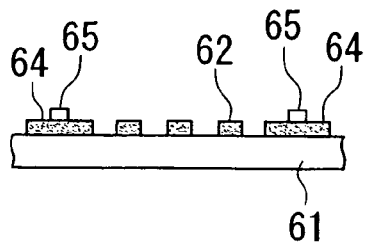
Figure 13C:
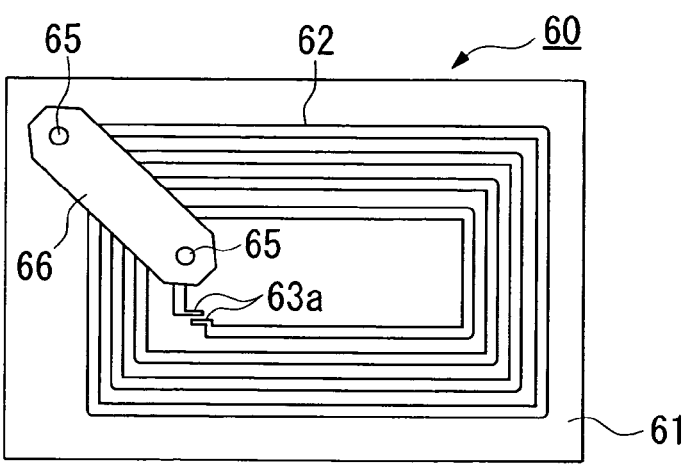
Figure 13D:
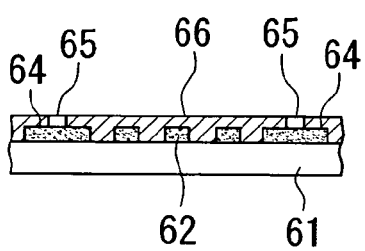

As follows is a description of an electronic device and a production method for an electronic device that utilize a metal element formation method according to one of the first through seventh embodiments described above, with reference to FIG. 13A to FIG. 13F. FIG. 13A to FIG. 13F shows a wireless IC card (an electronic device) equipped with a coil antenna, wherein FIG. 13B, FIG. 13D and FIG. 13F represent cross sectional views of the region between the two pad sections 65 in FIG. 13A, FIG. 13C and FIG. 13E respectively.

Only those areas of this embodiment that differ from the previous embodiments are described below. Components that are the same as the previous embodiments are labeled with the same symbols, and their descriptions are omitted.

(IC Card)

Figure 13E:
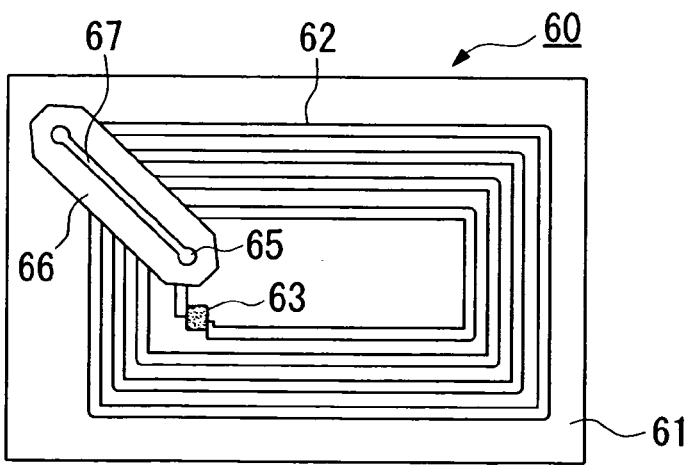
Figure 13F:
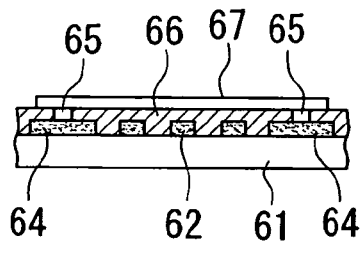

In FIG. 13E, a wireless IC card 60 comprises an IC chip 63 mounted on a polyimide film (a substrate) 61, a coiled antenna (a plating layer, wiring layer) 62, pad sections (a plating layer, wiring layer) 64 and connection posts (a plating layer) 65. The IC chip 63 is formed from a non-volatile memory, a logic circuit, and a high frequency circuit and the like, and is operated by capturing an electrical wave transmitted by an external transmitter, and receiving a supply of power. Furthermore, the IC chip 63 interprets the signal received by the antenna 62, and then emits the required predetermined signals from the antenna 62 in accordance with the results of that interpretation.

(Production Method for Wireless IC Card)

As follows is a description of a production method for a wireless IC card, with reference to FIG. 13A through FIG. 13E.

First, as shown in FIG. 13A, the antenna 62 is formed on top of the polyimide film 61, and the pad sections 64 and the terminals 63a for mounting the IC chip 63 are also formed at the same time. In addition, following formation of the antenna 62, the connection posts 65 are formed on top of the pad sections 64. Because these formation steps utilize the seed layer formation step and the plating layer formation step described in the previous embodiments, similar effects to those described in the previous embodiments can be achieved.

Subsequently, as shown in FIG. 13C, a polyimide film is applied in a pattern so as to leave the upper surface of the connection posts 65 exposed, thereby forming an interlayer insulating film 66.

Next, wiring (a plating layer, wiring layer) 67 is formed to connect the connection posts 65 exposed at the surface of the interlayer insulating film 66. Finally, the IC chip 63 is mounted at the position shown in FIG. 13E using an anisotropic conductive film, and the entire construction is then covered with a protective film (not shown in the drawing), thereby completing production of the wireless IC card 60. Because the formation step for the aforementioned wiring 67 utilizes the seed layer formation step and the plating layer formation step described in the previous embodiments, similar effects to those described in the previous embodiments can be achieved.

This wireless IC card 60 can be used to communicate with an external reader/writer across short distances (of approximately 10 cm or less).

In those cases in which the pad sections 64 are a comparatively large size of several square mm, then by not forming the interlayer connection posts 65, and forming the interlayer insulating film 66 with regions large enough to ensure interlayer connection, multilayer printed wiring can be provided. In such cases, because the edge sections of the interlayer insulating film 66 above the pad sections 64 will have a tapered shape, the wiring 67 can be formed without any disconnection above the interlayer insulating film 66, by simply conducting the seed layer formation step and the plating layer formation step described in the previous embodiments.

(Tenth Embodiment)

As follows is a description of electronic equipment equipped with a semiconductor device or an electronic device according to the previous embodiments.

FIG. 14 is a perspective view of a sample mobile telephone. In FIG. 14, the numeral 1000 represents the main body of the mobile telephone, and the numeral 1001 represents a display section equipped with thin film transistors (a semiconductor device).

Figure 15:
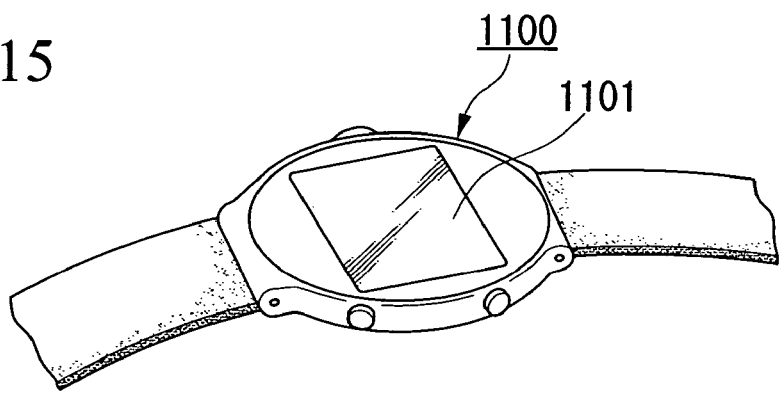
FIG. 15 is a diagram showing another example of a piece of electronic equipment equipped with a semiconductor device of the present invention.

FIG. 15 is a perspective view of a sample electronic wrist watch. In FIG. 15, the numeral 1100 represents the main body of the watch, and the numeral 1101 represents a display section equipped with thin film transistors (a semiconductor device).

Figure 16:
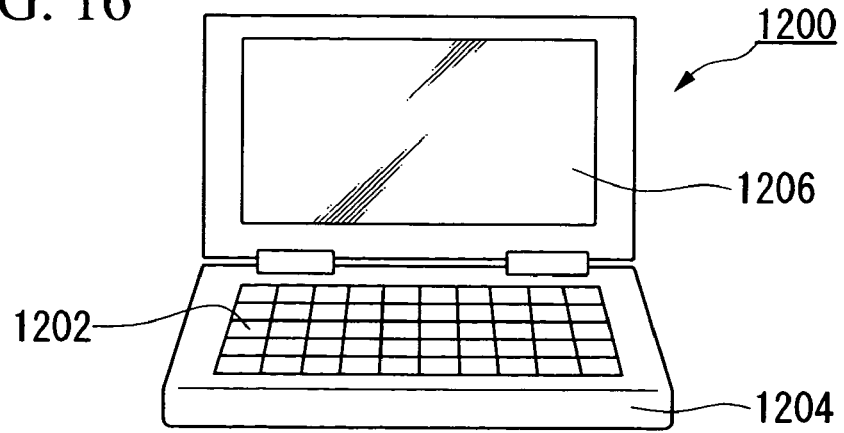
FIG. 16 is a diagram showing yet another example of a piece of electronic equipment equipped with a semiconductor device of the present invention.

FIG. 16 is a perspective view of a portable information processing device such as a word processor or a laptop computer. In FIG. 16, the numeral 1200 represents the information processing device, the numeral 1202 represents an input section such as a keyboard, the numeral 1204 represents the main body of the information processing device, and the numeral 1206 represents a display section equipped with thin film transistors (a semiconductor device).

The electronic equipment shown in FIG. 14 through FIG. 16 comprise transistors according to the embodiment described above, and consequently enable the provision of low cost electronic equipment.

The technical scope of the present invention is in no way restricted by the embodiments described above, and a multitude of modifications are possible, provided they retain the gist of the present invention. The specific materials and layer configurations presented in the embodiments are nothing more than examples, and can be suitably modified.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A metal element formation method comprising:
    a liquid repellent section formation step of forming a liquid repellent section on an entirety of a treatment surface of a substrate;
    a lyophilic section formation step of forming a lyophilic section by removing a portion of said liquid repellent section;
    a film formation step of forming a seed layer on said lyophilic section by discharging a liquid material for said lyophilic section using a liquid discharge method;
    a plating formation step of forming a plating layer on said seed layer; and
    an insulating film formation step of forming an insulating film on said treatment surface of said substrate while retaining said liquid repellent section on said treatment surface.

2. A metal element formation method according to claim 1, wherein in said film formation step and said plating layer formation step, said seed layer and said plating layer are formed using the same material.

3. A metal element formation method according to claim 1, wherein in said film formation step and said plating layer formation step, said seed layer and said plating layer are formed using different materials.

4. A metal element formation method according to claim 1, wherein a liquid material comprising metal atoms is used in said film formation step.

5. A metal element formation method according to claim 4, wherein a liquid material comprising copper atoms is used in said film formation step.

6. A metal element formation method according to claim 4, wherein a liquid material comprising an organocopper compound is used in said film formation step.

7. A metal element formation method according to claim 1, further comprising:
an etching step of etching said insulating film and exposing said plating layer, which are conducted following completion of said insulating film formation step.

8. A metal element formation method according to claim 7, wherein in said insulating film formation step, an insulating film that has been formed as a thin film is transferred to said treatment surface, and forms said insulating film on said treatment surface.

9. A metal element formation method according to claim 7, wherein in said insulating film formation step, said insulating film is formed by placing a liquid material containing insulating matter in contact with said treatment surface, and conducting a subsequent heat treatment.

* * * * *